United States Patent
Fulford et al.

(10) Patent No.: US 12,342,568 B2
(45) Date of Patent: Jun. 24, 2025

(54) 3D DEVICE WITH A PLURALITY OF CORE WIRING LAYOUT ARCHITECTURE

(71) Applicant: Tokyo Electron Limited, Tokyo (JP)

(72) Inventors: H. Jim Fulford, Albany, NY (US); Mark I. Gardner, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 227 days.

(21) Appl. No.: 17/691,840

(22) Filed: Mar. 10, 2022

(65) Prior Publication Data

US 2022/0293789 A1    Sep. 15, 2022

Related U.S. Application Data

(60) Provisional application No. 63/159,658, filed on Mar. 11, 2021.

(51) Int. Cl.
*H10D 30/63* (2025.01)
*H10D 30/01* (2025.01)
(Continued)

(52) U.S. Cl.
CPC .......... *H10D 30/63* (2025.01); *H10D 30/025* (2025.01); *H10D 30/6728* (2025.01);
(Continued)

(58) Field of Classification Search
CPC ............. H01L 29/7827; H01L 29/1037; H01L 29/66666; H01L 29/0676; H01L 29/401; H01L 29/41741; H01L 29/7831; H01L 29/78642; H01L 21/8221; H01L 21/823487; H01L 21/823828; H01L 21/823871; H01L 21/823885; H01L 27/0688; H01L 27/092; H10D 30/63; H10D 30/025; H10D 30/611; H10D 30/6728; H10D 30/6704; H10D 30/674; H10D 62/292; H10D 62/122; H10D 64/01; H10D 64/252; H10D 64/2523; H10D 64/2527;
(Continued)

(56) References Cited

U.S. PATENT DOCUMENTS 5,382,816 A * 1/1995 Mitsui ................ H01L 29/7827
                                          257/E29.267
5,656,842 A * 8/1997 Iwamatsu ........... H01L 29/7831
                                          257/E29.264
(Continued)

FOREIGN PATENT DOCUMENTS

WO    WO-2019/123142    6/2019

OTHER PUBLICATIONS

International Search Report and Written Opinion on PCT Appl. Ser. No. PCT/2022/019502 dated Jun. 21, 2022 (10 pages).

*Primary Examiner* — Michael M Trinh
(74) *Attorney, Agent, or Firm* — Foley & Lardner LLP

(57) ABSTRACT

Systems and methods for manufacturing semiconductor devices. The system can include a semiconductor device. The semiconductor device can include a semiconductor shell that extends along a vertical direction. The semiconductor device can include a first metal structure surrounded by a lower portion of the semiconductor shell. The semiconductor device can include a dielectric structure above the first metal structure. The semiconductor device can include a second metal structure through the dielectric structure.

20 Claims, 37 Drawing Sheets

(51) Int. Cl.
*H10D 30/67* (2025.01)
*H10D 62/17* (2025.01)
*H10D 84/01* (2025.01)
*H10D 84/03* (2025.01)
*H10D 84/85* (2025.01)
*H10D 88/00* (2025.01)

(52) U.S. Cl.
CPC ......... *H10D 62/292* (2025.01); *H10D 84/016* (2025.01); *H10D 84/0172* (2025.01); *H10D 84/0186* (2025.01); *H10D 84/0195* (2025.01); *H10D 84/038* (2025.01); *H10D 84/85* (2025.01); *H10D 88/00* (2025.01); *H10D 88/01* (2025.01)

(58) Field of Classification Search
CPC .... H10D 84/016; H10D 84/038; H10D 84/01; H10D 84/0186; H10D 84/0195; H10D 84/0172; H10D 84/85; H10D 84/851; H10D 84/852; H10D 84/02; H10D 84/032; H10D 84/035; H10D 84/05; H10D 84/07; H10D 84/08; H10D 88/00; H10D 88/01
See application file for complete search history.

(56) References Cited

U.S. PATENT DOCUMENTS

| | | | |
|---|---|---|---|
| 9,024,376 | B2 | 5/2015 | Masuoka et al. |
| 9,425,324 | B2 | 8/2016 | Diaz et al. |
| 9,478,624 | B2 | 10/2016 | Colinge et al. |
| 10,361,315 | B1 | 7/2019 | Yeh et al. |
| 10,720,509 | B1* | 7/2020 | Liao .................. H01L 29/4238 |
| 2008/0061316 | A1* | 3/2008 | Cohen ............... H01L 29/66795 257/190 |
| 2010/0252879 | A1* | 10/2010 | Ogawa ................ H01L 29/7827 257/E29.183 |
| 2014/0008606 | A1* | 1/2014 | Hussain ............ H01L 29/66484 438/306 |
| 2014/0166981 | A1 | 6/2014 | Doyle et al. |
| 2016/0149054 | A1 | 5/2016 | Basu et al. |
| 2017/0148899 | A1* | 5/2017 | Ohtou ................ H01L 29/1054 |
| 2017/0352625 | A1* | 12/2017 | Leobandung ... H01L 21/823475 |
| 2019/0067475 | A1* | 2/2019 | Liu ........................ H01L 29/267 |
| 2019/0172828 | A1* | 6/2019 | Smith .............. H01L 21/28088 |
| 2020/0058798 | A1 | 2/2020 | Pillarisetty et al. |
| 2021/0172906 | A1* | 6/2021 | Hussain .............. H01L 29/0676 |
| 2021/0280474 | A1* | 9/2021 | Wang ............... H01L 29/66795 |
| 2022/0102552 | A1* | 3/2022 | Fulford ........... H01L 21/823878 |

* cited by examiner

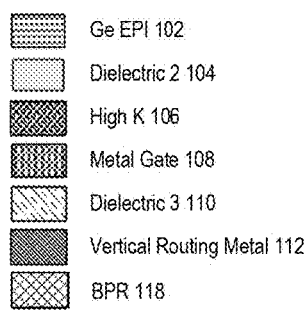
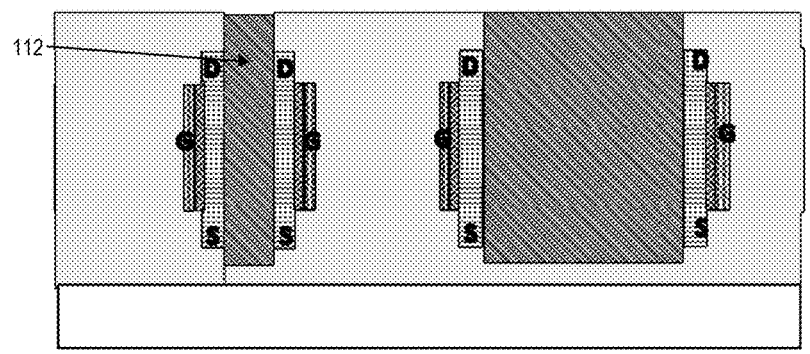
FIG. 4
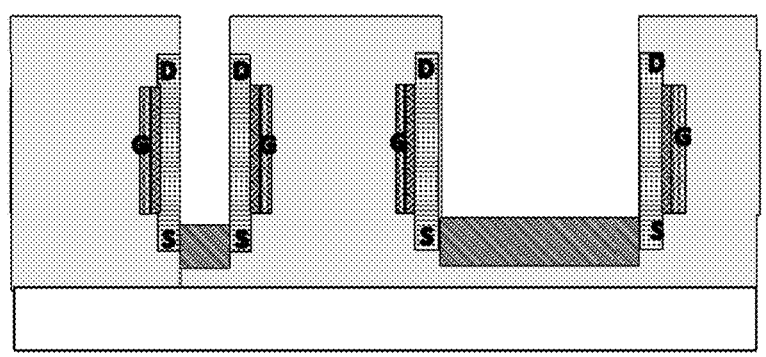
FIG. 5

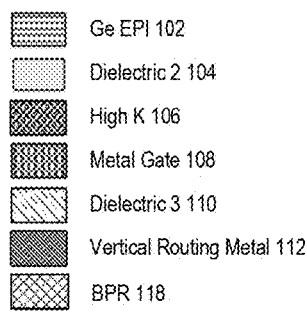
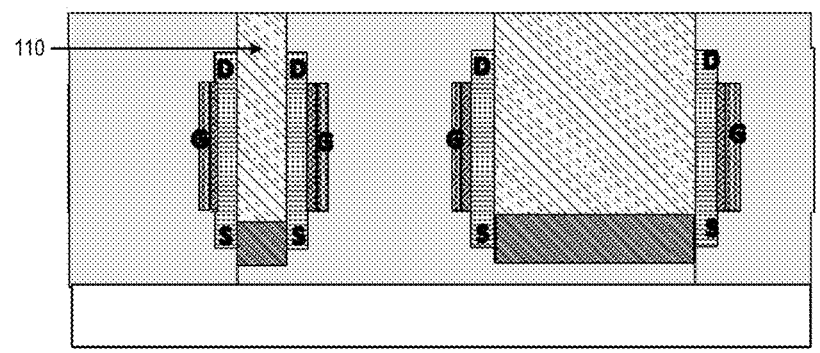
FIG. 6
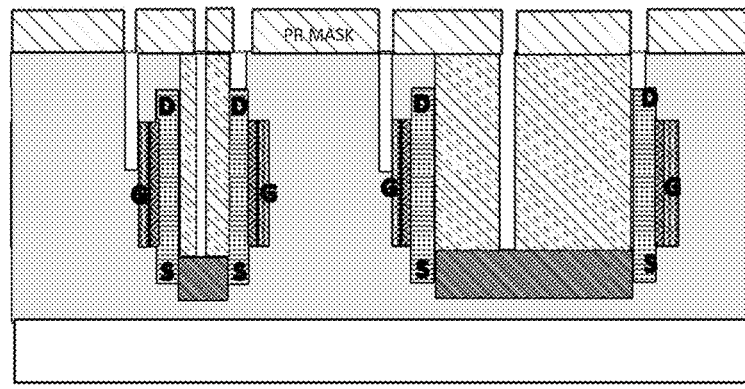
FIG. 7

- Ge EPI 102
- Dielectric 2 104
- High K 106
- Metal Gate 108
- Dielectric 3 110
- Vertical Routing Metal 112
- Dielectric 4 116
- BPR 118
- Metal 1 136

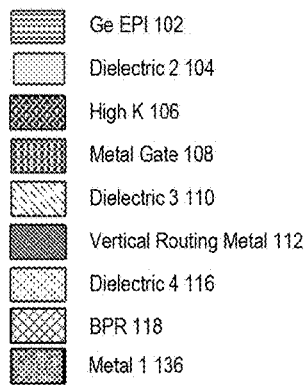
Ge EPI 102
Dielectric 2 104
High K 106
Metal Gate 108
Dielectric 3 110
Vertical Routing Metal 112
Dielectric 4 116
BPR 118
Metal 1 136
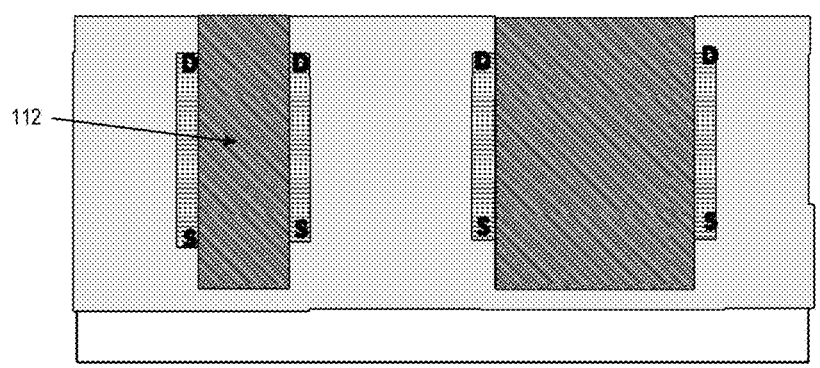
FIG. 11
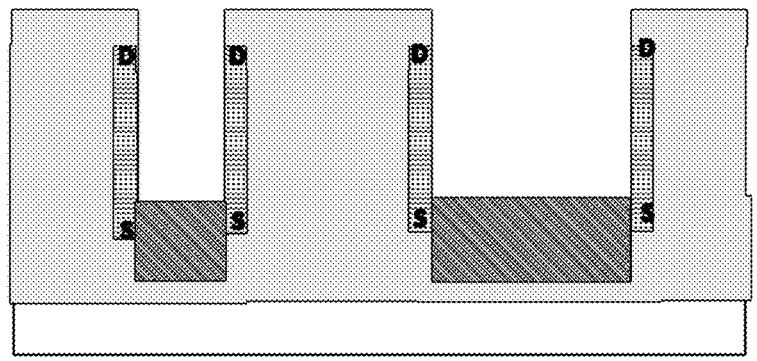
FIG. 12

 Ge EPI 102
 Dielectric 2 104
 High K 106
 Metal Gate 108
 Dielectric 3 110
 Vertical Routing Metal 112
 Dielectric 4 116
 BPR 118
 Metal 1 136
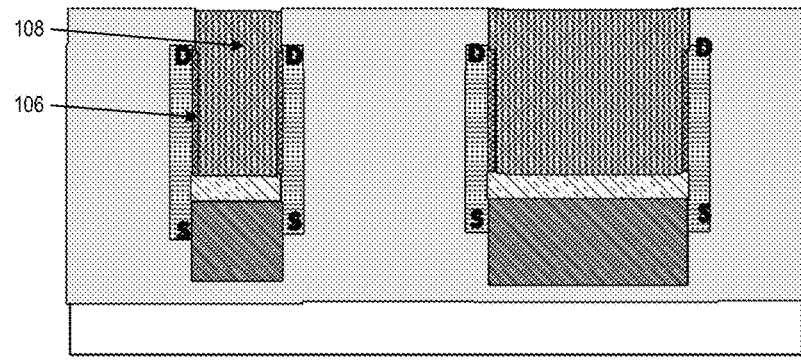
FIG. 15
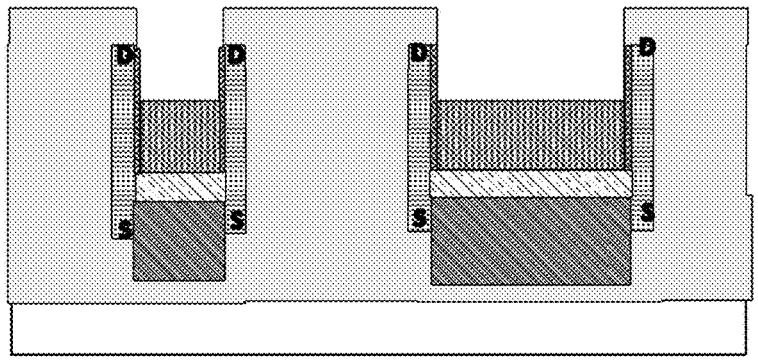
FIG. 16

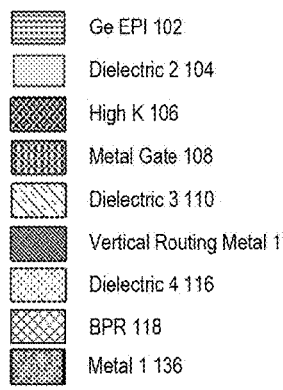
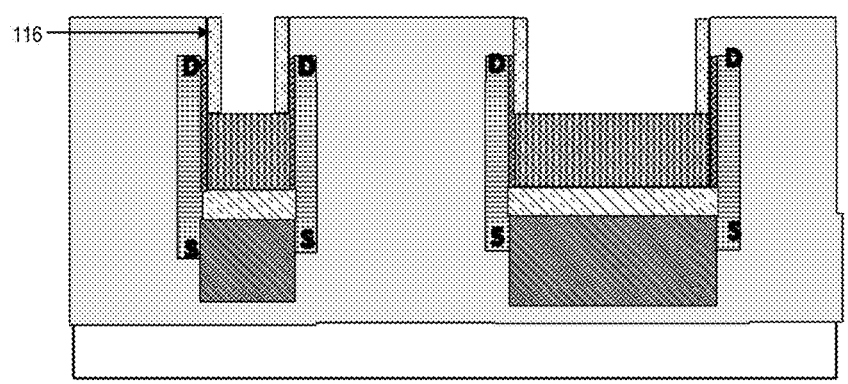
FIG. 17
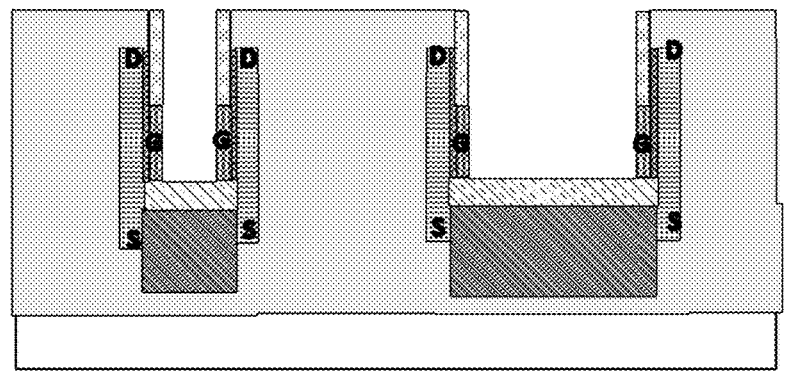
FIG. 18

▨ Ge EPI 102
☐ Dielectric 2 104
▨ High K 106
▨ Metal Gate 108
▨ Dielectric 3 110
▨ Vertical Routing Metal 112
▨ Dielectric 4 116
▨ BPR 118
▨ Metal 1 136

| | |
|---|---|
| | Dielectric 2 104 |
| | High K 106 |
| | Metal Gate 108 |
| | Dielectric 3 110 |
| | Vertical Routing Metal 112 |
| | Dielectric 4 116 |
| | Metal 2 Gate 120 |
| | Dielectric for diffusion break 122 |
| | P+ EPI 124 |
| | N+ EPI 126 |
| | Capping Layer 128 |
| | Dielectric 1 130 |
| | Metal 1 132 |
| | Metal 2 134 |

Dielectric 2 104
High K 106
Metal Gate 108
Dielectric 3 110
Vertical Routing Metal 112
Dielectric 4 116
Metal 2 Gate 120
Dielectric for diffusion break 122
P+ EPI 124
N+ EPI 126
Capping Layer 128
Dielectric 1 130
Metal 1 132
Metal 2 134

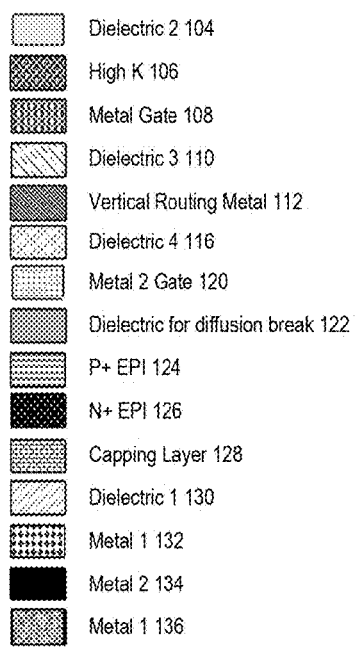
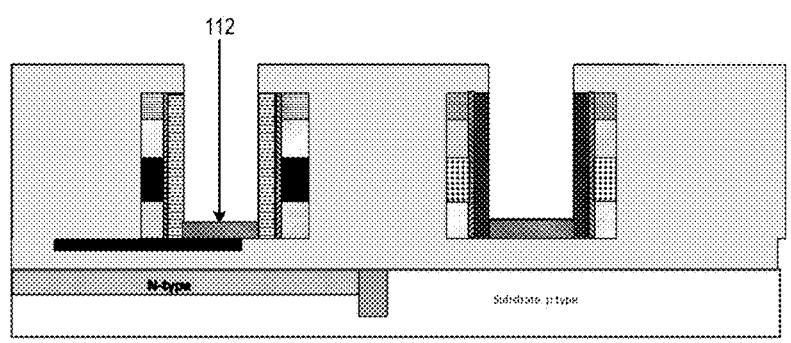
FIG. 45
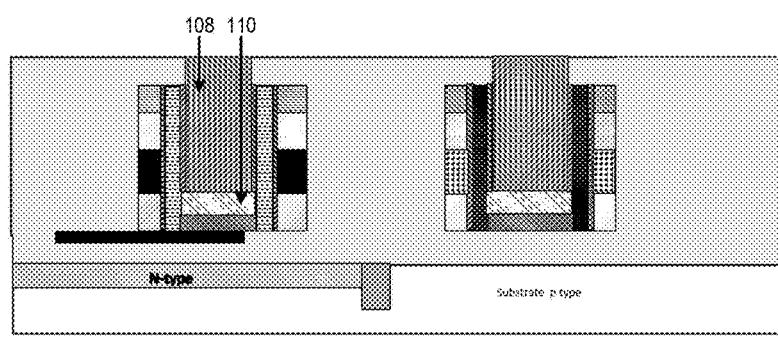
FIG. 46

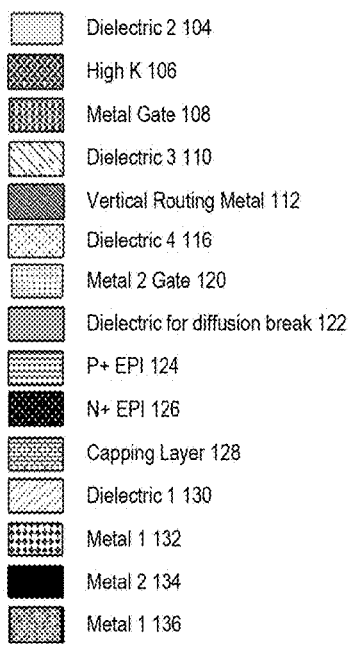
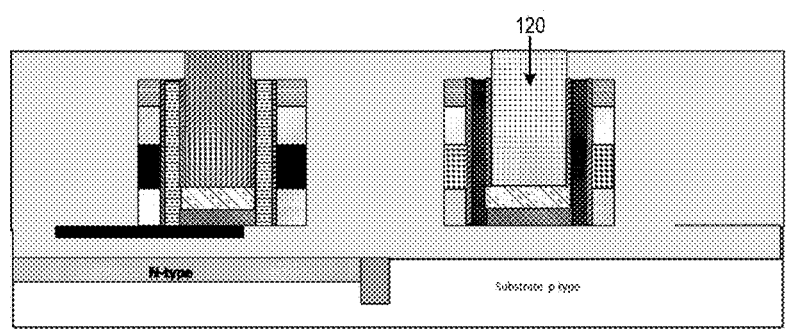
FIG. 47
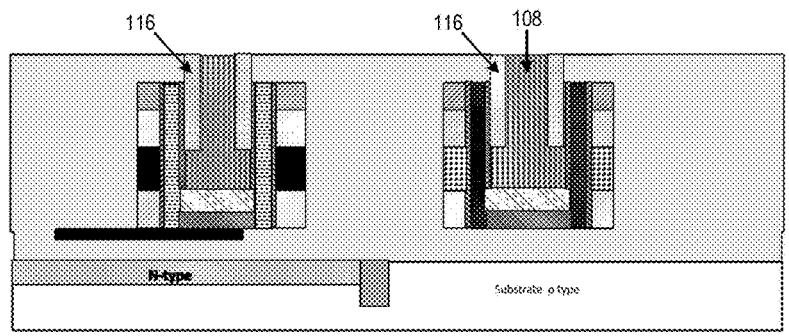
FIG. 48

Dielectric 2 104
High K 106
Metal Gate 108
Dielectric 3 110
Vertical Routing Metal 112
Dielectric 4 116
Metal 2 Gate 120
Dielectric for diffusion break 122
P+ EPI 124
N+ EPI 126
Capping Layer 128
Dielectric 1 130
Metal 1 132
Metal 2 134
Metal 1 136

 Dielectric 2 104
 High K 106
 Metal Gate 108
 Dielectric 3 110
 Vertical Routing Metal 112
 Dielectric 4 116
 Metal 2 Gate 120
 Dielectric for diffusion break 122
 P+ EPI 124
 N+ EPI 126
 Capping Layer 128
 Dielectric 1 130
 Metal 1 132
 Metal 2 134
 Metal 1 136
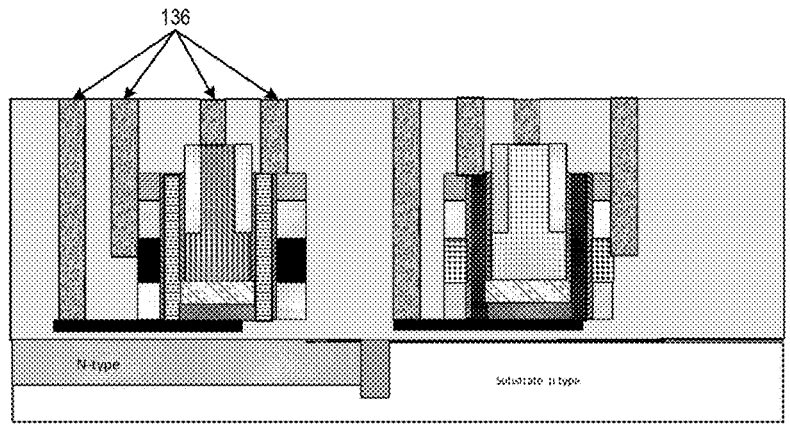
FIG. 51

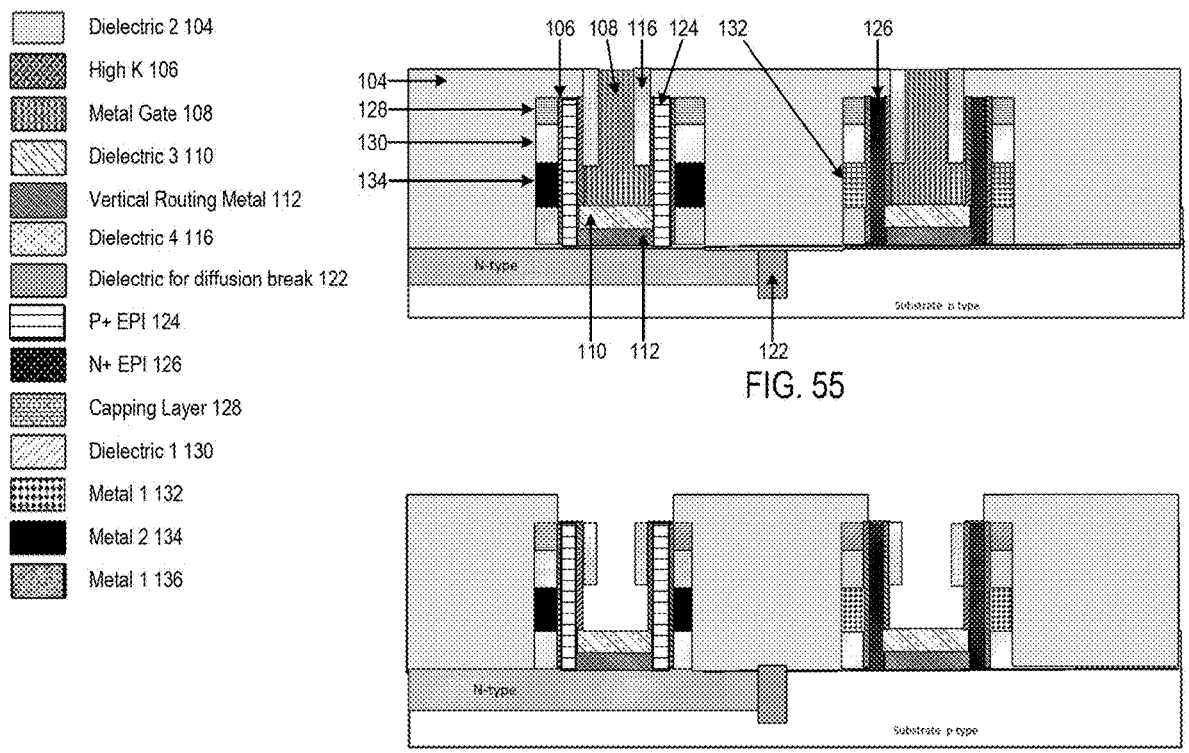

| | |
|---|---|
| ☐ | Dielectric 2 104 |
| ▨ | High K 106 |
| ▨ | Metal Gate 108 |
| ▨ | Dielectric 3 110 |
| ▨ | Vertical Routing Metal 112 |
| ▨ | Dielectric 4 116 |
| ▨ | Dielectric for diffusion break 122 |
| ▤ | P+ EPI 124 |
| ■ | N+ EPI 126 |
| ▨ | Capping Layer 128 |
| ▨ | Dielectric 1 130 |
| ▨ | Metal 1 132 |
| ■ | Metal 2 134 |
| ▨ | Metal 1 136 |

| | |
|---|---|
| ▢ | Dielectric 2 104 |
| ▨ | High K 106 |
| ▨ | Metal Gate 108 |
| ▨ | Dielectric 3 110 |
| ▨ | Vertical Routing Metal 112 |
| ▨ | Dielectric 4 116 |
| ▨ | Dielectric for diffusion break 122 |
| ▨ | P+ EPI 124 |
| ▨ | N+ EPI 126 |
| ▨ | Capping Layer 128 |
| ▨ | Dielectric 1 130 |
| ▨ | Metal 1 132 |
| ▨ | Metal 2 134 |
| ▨ | Metal 1 136 |

3D DEVICE WITH A PLURALITY OF CORE WIRING LAYOUT ARCHITECTURE

CROSS-REFERENCE TO RELATED APPLICATIONS

This application claims priority to U.S. Provisional Patent Application Ser. No. 63/159,658, filed Mar. 11, 2021, which is incorporated by reference in its entirety.

TECHNICAL FIELD

This disclosure relates to microelectronic devices including semiconductor devices, transistors, and integrated circuits, including methods of microfabrication.

BACKGROUND

In the manufacture of semiconductor devices (especially on the microscopic scale), various fabrication processes are executed, such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes.

SUMMARY

Semiconductor device fabricators have expressed a desire for three-dimensional (3D) semiconductor circuits in which transistors are stacked on top of each other. 3D integration, e.g., a stacking (or vertical arrangement) of multiple semiconductor devices (e.g., transistor structures), can overcome scaling limitations experienced in planar devices (e.g., two-dimensional (2D) planer device) by increasing transistor density in volume rather than area. Although device stacking has been successfully demonstrated and implemented by the flash memory industry with the adoption of 3D NAND, application to random logic designs is substantially more difficult. 3D integration for logic chips (e.g., CPU (central processing unit), GPU (graphics processing unit), FPGA (field programmable gate array, SoC (System on a chip)) is desirable.

Techniques herein include methods and devices for 3D fabrication of semiconductor devices. Techniques may include using a vertical dielectric core, which can be replaced to make 3D devices and also metal routing and connections by using these dielectric core regions. Embodiments herein may provide several process flows to achieve this vertical routing feature.

Such techniques enable higher-density circuits to be produced at a reduced cost. Techniques herein enable both a gate electrode and S/D connection in the center dielectric core of the 3D vertical transistor, thereby enabling two or more metal lines routed within the dielectric core. A vertical dielectric core can be used and replaced to make both 3D devices and also metal routing and connections by using dielectric core regions. Any 3D vertical device with a dielectric core can use techniques herein. Embodiments herein may provide several process flows to achieve this vertical routing feature. Such techniques enable a relatively high packing density of corresponding circuits. Routing can be made in multiple 360-degree shells of metal routing. Any geometry can be used (e.g., circle, rectangle, cylinder). Using a vertical dielectric core with vertical nanosheets greatly increases the density of metal lines relative to horizontal 3D nanosheet devices. Embodiments include an option for one metal line in the dielectric. Both a gate electrode and S/D connection in the center dielectric core of the 3D vertical transistor are enabled herein, thereby providing two or more metal lines routed within the dielectric core. Embodiments also include a pass-through of one or two multiple 3D vertical lines to upper transistor and/or layout connections.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the disclosed features can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

The systems and methods of the technical solution can form, structure, or construct 3D semiconductor devices with a vertical layout using 3D epitaxy (epi) nanosheets. A vertical transistor dielectric core can be utilized and partially replaced to form one or more 3D devices, metal routings, and/or connections for instance by disposing or forming a number of 3D metal lines or structures within the dielectric core regions. Utilizing the dielectric core region can enable passthrough of one or more metal linings to at least an upper transistor and/or layout connections. Hence, the systems and methods discussed herein can enable/allow for high-packing density of the circuit to form the vertical semiconductor device.

At least one aspect of the present disclosure is directed to a method for manufacturing semiconductor devices. The method can include forming a semiconductor shell that extends along a vertical direction. The method can include forming a first metal structure surrounded by a lower portion of the semiconductor shell. The method can include forming a dielectric structure above the first metal structure. The method can include forming a second metal structure through the dielectric structure.

In some implementations, forming the semiconductor shell can further include forming a first source/drain structure and a second source/drain structure. The method can include forming a third metal structure extending along the vertical direction and in electrical contact with a metal gate around an outer sidewall of the semiconductor shell. The method can include forming a fourth metal structure extending along the vertical direction and in electrical contact with the first source/drain structure or the second source/drain structure.

In some implementations, the semiconductor shell can comprise a first source/drain structure and a second source/drain structure. The method can include forming a metal gate around an inner sidewall of the semiconductor shell. The metal gate can include a portion extending along the vertical direction beyond a top of the semiconductor shell. The method can include forming a third metal structure in electrical contact with the metal gate. The method can include forming a fourth metal structure extending along the vertical direction and in electrical contact with the first source/drain structure or the second source/drain structure.

In some implementations, the method can include forming a second semiconductor shell that extends along the vertical direction. The second semiconductor shell can comprise a third source/drain structure and a fourth source/drain structure. The method can include forming a fifth metal structure surrounded by a lower portion of the second semiconductor shell. The method can include forming a second metal gate around an inner sidewall of the second semiconductor shell. The second metal gate can include a portion extending along the vertical direction beyond a top of the second semiconductor shell. The method can include forming a second dielectric structure above the fifth metal structure. The method can include forming a sixth metal structure in electrical contact with the third metal gate. The method can include forming a seventh metal structure in electrical contact with the third source/drain structure or the fourth source/drain structure. In some implementations, the method can include forming a power rail in electrical contact with the fifth metal structure. The power rail can be disposed below the fifth metal structure.

In some implementations, forming the semiconductor shell can further include forming an outer shell surrounded by a first metal gate, and include forming a first source/drain structure and a second source/drain structure. The method can include forming a second metal gate around an inner sidewall of the semiconductor shell. The method can include forming a third metal structure through the dielectric structure to be in electrical contact with the second metal gate. The method can include forming a fourth metal structure in electrical contact with the first metal gate. The method can include forming a fifth metal structure in electrical contact with the first source/drain structure or the second source/drain structure.

In some implementations, forming the semiconductor shell can further include forming an outer shell surrounded by a first metal gate, and include forming a first source/drain structure and a second source/drain structure. The method can include forming a second metal gate disposed above the first metal structure and surrounded by the semiconductor shell. The second metal gate can include a portion extending along the vertical direction beyond a top of the semiconductor shell, and surrounded by the dielectric structure. The method can include forming a third metal structure in electrical contact with the sixth metal gate. The method can include forming a four metal structure in electrical contact with the second metal gate. The method can include forming a fifth metal structure in electrical contact with the first source/drain structure or the second source/drain structure. In some implementations, the method can include forming a power rail in electrical contact with the first metal structure. The power rail can be disposed below the first metal structure.

In some implementations, forming the semiconductor shell can further include forming an outer shell surrounded by a first metal gate, and include forming a first source/drain structure and a second source/drain structure. The method can include forming a second metal gate disposed above the first metal structure and surrounded by the semiconductor shell. The second metal gate can include a portion extending along the vertical direction beyond a top of the semiconductor shell, and surrounded by the dielectric structure. The method can include removing at least a portion of the second metal gate, thereby forming an opening surrounded by the semiconductor shell. The method can include lining the opening with a third metal gate. The method can include forming a third metal structure in electrical contact with the first metal gate. The method can include forming a fourth metal structure in electrical contact with the tenth metal gate. The method can include forming a fifth metal structure in electrical contact with the first source/drain structure or the second source/drain structure. The fifth metal structure may be formed concurrently with the formation of the third metal gate.

In some implementations, forming the semiconductor shell can further include forming an outer shell o surrounded by a first metal gate, and include forming a first source/drain structure and a second source/drain structure. The method can include forming a second metal gate around an inner sidewall of the semiconductor shell. The second metal gate can surround the dielectric structure. The method can include forming a third metal structure extending through the dielectric structure to be in electrical contact with the second metal gate. The method can include forming a fourth metal structure in electrical contact with the first metal gate. The method can include forming a fifth metal structure in electrical contact with the first source/drain structure or the second source/drain structure.

At least one other aspect of the present disclosure is directed to a semiconductor device. The semiconductor device can include a semiconductor shell extending along a vertical direction. The semiconductor device can include a first metal structure surrounded by a lower portion of the semiconductor shell. The semiconductor device can include a dielectric structure above the first metal structure. The semiconductor device can include a second metal structure through the dielectric structure.

In some implementations, the semiconductor shell can comprise a first source/drain structure and a second source/drain structure. The semiconductor device can include a third metal structure extending along the vertical direction and in electrical contact with a metal gate around an outer sidewall of the semiconductor shell. The semiconductor device can include a fourth metal structure extending along the vertical direction and in electrical contact with the first source/drain structure or the second source/drain structure.

In some implementations, the semiconductor shell can comprise a first source/drain structure and a second source/drain structure. The semiconductor device can include a metal gate around an inner sidewall of the semiconductor shell. The metal gate can include a portion extending along the vertical direction beyond a top of the semiconductor shell. The semiconductor device can include a third metal structure in electrical contact with the metal gate. The semiconductor device can include a fourth metal structure extending along the vertical direction and in electrical contact with the first source/drain structure or the second source/drain structure.

In some implementations, the semiconductor device can include a second semiconductor shell that extends along the vertical direction. The second semiconductor shell can comprise a third source/drain structure and a fourth source/drain structure. The semiconductor device can include a fifth metal structure surrounded by a lower portion of the second semiconductor shell. The semiconductor device can include a second metal gate around an inner sidewall of the second semiconductor shell. The second metal gate can include a portion extending along the vertical direction beyond a top of the second semiconductor shell. The semiconductor device can include a second dielectric structure above the fifth metal structure. The semiconductor device can include a sixth metal structure in electrical contact with the second metal gate. The semiconductor device can include a seventh metal structure in electrical contact with the third source/drain structure or the fourth source/drain structure. In some implementations, the semiconductor device can include a power rail in electrical contact with the fifth metal structure. The power rail can be disposed below the fifth metal structure.

In some implementations, an outer shell of the semiconductor shell may be surrounded by a first metal gate, and the semiconductor shell can comprise a first source/drain structure and a second source/drain structure. The semiconductor device can include a second metal gate around an inner sidewall of the semiconductor shell. The semiconductor device can include a third metal structure through the dielectric structure to be in electrical contact with the second metal gate. The semiconductor device can include a fourth metal structure in electrical contact with the first metal gate. The semiconductor device can include a fifth metal structure in electrical contact with the first source/drain structure or the second source/drain structure.

In some implementations, an outer shell of the semiconductor shell may be surrounded by a first metal gate, and the semiconductor shell can comprise a first source/drain structure and a second source/drain structure. The semiconductor device can include a second metal gate disposed above the first metal structure and surrounded by the semiconductor shell. The second metal gate can include a portion extending along the vertical direction beyond a top of the semiconductor shell, and surrounded by the dielectric structure. The semiconductor device can include a third metal structure in electrical contact with the first metal gate. The semiconductor device can include a fourth metal structure in electrical contact with the second metal gate. The semiconductor device can include a fifth metal structure in electrical contact with the first source/drain structure or the second source/drain structure. In some implementations, the semiconductor device can include a power rail in electrical contact with the first metal structure. The power rail can be disposed below the first metal structure.

In some implementations, an outer shell of the semiconductor shell may be surrounded by a first metal gate, and the semiconductor shell can comprise a first source/drain structure and a second source/drain structure. The semiconductor device can include a second metal gate disposed above the first metal structure and surrounded by the semiconductor shell. The second metal gate can include a portion extending along the vertical direction beyond a top of the semiconductor shell, and surrounded by the dielectric structure. The second metal gate can be removed thereby forming an opening surrounded by the semiconductor shell. The semiconductor device can include a third metal gate lined in the opening. The semiconductor device can include a third metal structure in electrical contact with the first metal gate. The semiconductor device can include a fourth metal structure in electrical contact with the third metal gate. The semiconductor device can include an fifth metal structure in electrical contact with the first source/drain structure or the second source/drain structure. The fifth metal structure can be formed concurrently with the formation of the third metal gate.

In some implementations, an outer shell of the semiconductor shell may be surrounded by a first metal gate, and the semiconductor shell can comprise a first source/drain structure and a second source/drain structure. The semiconductor device can include a a second metal gate around an inner sidewall of the semiconductor shell. The second metal gate can surround the dielectric structure. The semiconductor device can include a third metal structure extending through the dielectric structure to be in electrical contact with the second metal gate. The semiconductor device can include a fourth metal structure in electrical contact with the first metal gate. The semiconductor device can include a fifth structure in electrical contact with the first source/drain structure or the second source/drain structure.

At least one other aspect of the present disclosure is directed to a method for manufacturing semiconductor devices. The method can include forming a first semiconductor shell and a second semiconductor shell that extend along a vertical direction. The method can include forming a first metal structure and a second metal structure surrounded by a lower portion of the first semiconductor shell and a lower portion of the second semiconductor shell, respectively. The method can include forming a first dielectric structure above the first metal structure. The method can include forming a second dielectric structure above the second metal structure. The method can include forming a third metal structure through the first dielectric structure.

In some implementations, the first semiconductor shell can comprise a first source/drain structure and a second source/drain structure, and the second semiconductor shell can comprise a third source/drain structure and a fourth source/drain structure. The method can include forming a fourth metal structure extending along the vertical direction and in electrical contact with a first metal gate around an outer sidewall of the first semiconductor shell. The method can include forming a fifth metal structure extending along the vertical direction and in electrical contact with the first source/drain structure or the second source/drain structure. The method can include forming a second metal gate around an inner sidewall of the second semiconductor shell. The second metal gate can include a portion extending along the vertical direction beyond a top of the second semiconductor shell. The method can include forming a sixth metal structure in electrical contact with the second metal gate. The method can include forming an seventh metal structure extending along the vertical direction and in electrical contact with the third source/drain structure or the fourth source/drain structure.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the invention can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIGS. 2-8 illustrate cross-sectional views of a process for Flow A to form a semiconductor device including vertical transistors with an inner isolated vertical metal core, according to an embodiment.

FIGS. 9-26 illustrate cross-sectional views of a process for Flow B to form a semiconductor device including vertical transistors using the inner metal core to allow connection to gate electrode region, according to an embodiment.

FIGS. 41-51 illustrate cross-sectional views of a process for Flow D1 to form a semiconductor device including vertical transistors with a buried power rail (BPR) having a top metal hook-up, according to an embodiment.

FIGS. 55-61 illustrate cross-sectional views of a process for Flow E1 to form a semiconductor device including vertical transistors using a conformal spacer to form a source/drain and gate electrode connection with one offset spacer, according to an embodiment.

DETAILED DESCRIPTION

Figure 1:
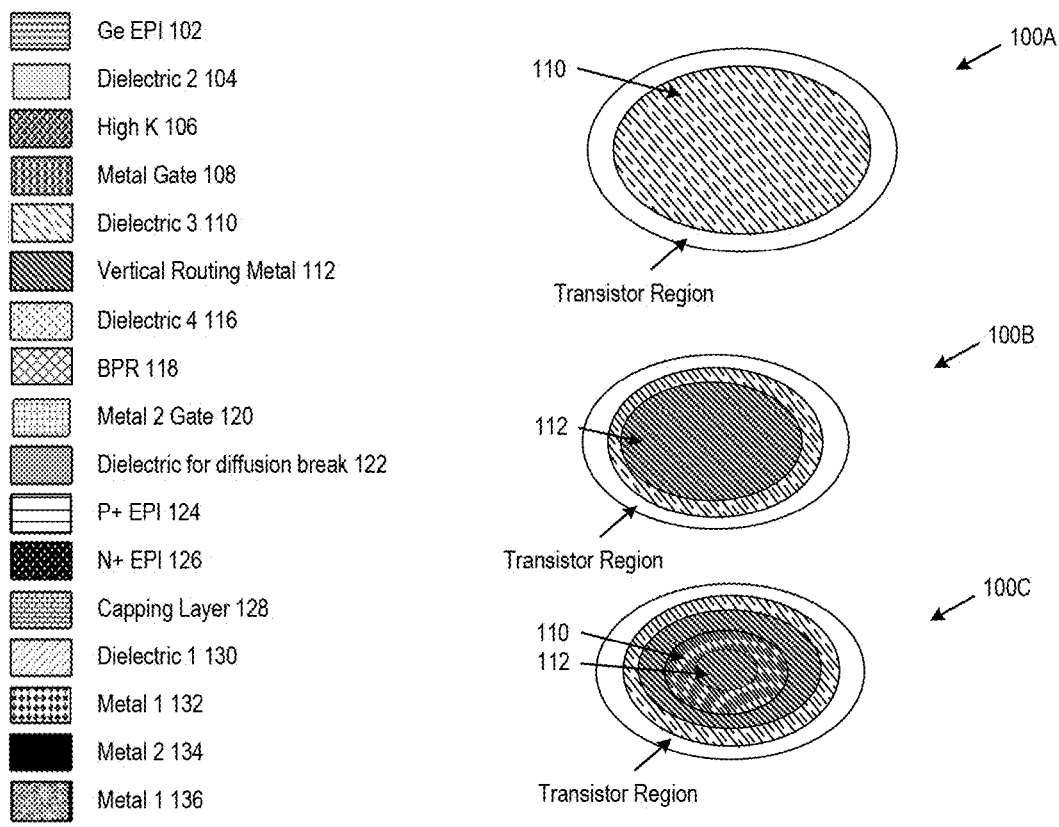
FIG. 1 illustrates top views of vertical channel transistors having a shell structure for a channel, according to an embodiment.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

This application relates to vertically oriented transistor devices and their methods of manufacture. More specifically, described herein are structures, processes, or operations for fabricating and improving vertical semiconductor devices by utilizing at least the core region of one or more transistors of the semiconductor device.

Electronic devices (e.g., transistors) are conventionally formed in horizontal planar configurations. However, limitations on the amount of area and required density of devices in a given footprint increasingly necessitate the use of novel structures. The present application provides devices oriented in a vertical direction, such that current flows in the vertical or z-direction allowing arrays of transistors to be stacked relative to the primary planar surface of the array or underlying substrate. Further, the devices, as disclosed herein, can each include a dielectric core. At least a portion of the dielectric core can be replaced with one or more metal structure(s) within the core region of the device for connection to an upper transistor.

The systems and methods of the technical disclosure discussed herein can include various process flows for fabricating the vertical semiconductor device with the core region of one or more transistors used for vertical routing. For example, Flow A can describe a process for fabricating a vertical transistor with an inner isolated vertical metal core to allow/enable connection to source/drain (S/D) region using an upper BPR from an upper plane. The vertical transistor and/or the core region of the transistor can be in any shape, such as cylinder, rectangle, ellipse, among others. This process flow can include forming at least one wiring feature in the dielectric core. Flow B can describe a process for using the inner metal core to allow connection to gate electrode region (e.g., connection to S/D and/or metal gate electrode within the core region) using the inner vertical core surface for transistor formation and using a BPR from a substrate. This process flow can include at least two wiring features in the dielectric core. Flow C can describe a process starting with an epi core with a completed/finished/formed device around the core. In Flow C, the epi core can be hollowed out to dispose an inner dielectric core. Subsequently, inner and outer gate electrodes can be formed. By forming the inner and outer gate electrodes (e.g., G1 and G2), dual biasing G1 and G2 can be enabled/allowed. This process flow can include two wiring features in the inner dielectric core for both NMOS and PMOS of the CMOS device.

In further example, Flow D1 can describe a process using Flow C as a base (e.g., process start with the semiconductor device from Flow C) and including/adding additional features of the BPR with top metal hook-up. In this process, the process of Flow C may be modified to have the BPR disposed at the bottom of the semiconductor shell or the transistor device. Flow D2 can describe a process using or starting with Flow C as a base and adding additional features of the BPR with bottom substrate metal hook-up. In this process, the process of Flow C can be modified to include the bottom BPR in the dielectric, such as below the semiconductor shell. Flow E1 can describe a process for using a conformal spacer to make a source (or drain) structure and gate electrode connection with one offset spacer in the dielectric core regions (e.g., using Flow D1 as a base). Flow E2 can describe a process for using a conformal spacer to make a source (or drain) structure and gate electrode connection with two offset spacers in the center dielectric core regions (e.g., using Flow C as a base).

Reference will now be made to the Figures, which for the convenience of visualizing the 3D fabrication techniques described herein, illustrate a substrate undergoing a process flow in cross-sectional views. Certain Figures can illustrate or present a top view of the substrate undergoing the process flow. Each Figure may represent one (or a set) of fabrication steps in a process flow for manufacturing the devices described herein. In the cross-sectional views of the Figures, connections between conductive layers or materials may be shown. However, it should be understood that these connections between various layers and masks are merely illustrative and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, although certain figures show various layers defining transistor structures or other electric structures in a circular configuration, other shapes are also contemplated, and indeed the techniques described herein may be implemented in any shape or geometry. In addition, examples in which two transistors or devices are shown stacked on top of one another are shown for illustrative purposes only, and for the purposes of simplicity. Indeed, the techniques described herein may provide for one to any number N stacked devices. Although the devices fabricated using these techniques are shown as transistors, it should be understood that any type of electric or electronic device may be manufactured using such techniques, including but not limited to transistors, variable resistors, resistors, and capacitors.

FIG. 1 illustrates top views of vertical channel transistors (e.g., transistors 100A, 100B, and 100C) having a shell structure for a channel, according to an embodiment. As shown in the top view of transistor 100A of a certain semiconductor device, a transistor region can be formed as a shell (e.g., semiconductor shell) of epitaxially grown or polycrystalline deposited semiconductor, such as Si, Ge, or GaAs, among others. The semiconductor shell may include or be formed as a shell of other semiconductor materials. For instance, the semiconductor shell is a transistor region including at least source/drain structures extending in a vertical direction. The semiconductor shell (among other portions of the transistor) can be formed by using any type of material deposition technique, including but not limited to ALD, chemical vapor deposition (CVD), and physical vapor deposition (PVD). Further, the semiconductor shell (among other portions of the transistor) can be formed by using any type of suitable etching techniques, including but not limited to dry etching, wet etching, or plasma etching techniques.

The transistor region is formed around a core structure or a core region occupied with a dielectric material/structure 110 (e.g., shown as "Dielectric 3" in the legend). To optimally utilize the core region occupied by the dielectric structure 110, a portion of the core region can be replaced with metal lining to provide an electrical connection vertically between different materials. As shown in transistor 100B, the core region includes a metal line (e.g., metal structure 112, labeled as "Vertical Routing Metal" in the legend) replacing a portion of the dielectric structure 110. Further, transistor 100C includes multiple metal lines within the core region. The one or more metal lines are used for routing metal wires within this space. Hence, the transistor 100B or transistor 100C can enable the routing of metal wires within the vertical core region to optimize current utilization and space within the core region, thereby increasing the density of the vertical semiconductor device.

FIGS. 2-8 illustrate cross-sectional views of a process for Flow A to form a semiconductor device including vertical transistors with an inner isolated vertical metal core. Each of the FIGS. 2-8 generally refer to one or more process steps in a process flow of Flow A, each of which are described in detail in connection with the respective Figure. For the purposes of simplicity and ease of visualization, some reference numbers may be omitted from some Figures. As used herein, the terms "first," "second," "third," and "fourth" with respect to particular structures of the semiconductor device shown in FIGS. 2-8 may be used for the purposes of simplicity and can be interchangeable between formations of different structures. For example, a "first," "second," and "third" metal structure may refer to the same or different metal structures formed at different processes of the flow. Hence, the terms "first," "second," and "third" can be used interchangeably, repetitively (e.g., in different flows), or for different types of structures (e.g, dielectric structures, metal structures, gate structures, etc.).

Figure 2:
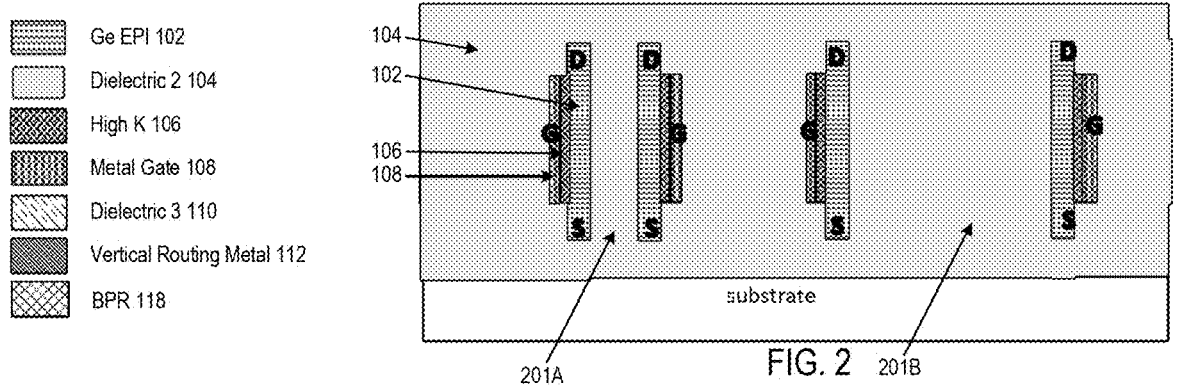

Referring to FIG. 2, illustrated is a cross-sectional view of a semiconductor device including transistors formed above a substrate. The substrate may be active or passive and may comprise dielectric, conductive, or semiconductive materials or any combination thereof. The substrate may be referred to as a base substrate or its respective material or composition. The substrate may remain in the final structure or may be removed during or after the formation of the VFET structure. One or more dielectric materials 104 (e.g., shown as "Dielectric 2" in the legend) may be provided on the substrate 102, among other portions of the transistor structure, to isolate the transistor structure from the underlying substrate. The dielectric material 104 may sometimes be referred to as an isolation layer, insulation layer, among other similar terms. The dielectric material 104 can be formed or composed of any type of dielectric material described herein that is capable of being disposed, patterned, or otherwise provided on the various layers described herein. Some examples of dielectric materials can include, but are not limited to, oxide materials.

As shown, completed 3D vertical transistors (e.g., left and right transistors) can be formed within the dielectric material 104. For example, a semiconductor shell can be formed within the dielectric material 104 extending along a vertical direction. A top view of the example semiconductor shell may be similar to the top view of the semiconductor device 100B or 100C shown in FIG. 1. For instance, from a top view, the shape of the semiconductor shell can be a circle, oval, rectangle, among other shapes, surrounding the core region. At this step in the process of Flow A, the core region can be occupied by the dielectric material 104.

The semiconductor shell can form a part of a transistor, such as including at least a first source/drain structure and a second source/drain structure. The term source/drain (S/D) will be used to describe structures that may be used as either a source or a drain of a transistor structure. The first and second S/D structures can be formed by an epi material 102 (e.g., labeled as "Ge EPI" in the legend). The semiconductor shell can surround a core region (e.g., shown as portion 201A and/or 201B). The epi material 102 may be referred to as a first S/D structure and/or a second S/D structure. The epi material 102 may be any type of conductive metal suitable to form a source or drain electrode in a semiconductor device, including copper, gold, silver, platinum, nickel, tungsten, ruthenium, or other types of conductive metals or alloys. The deposition or addition of materials above the substrate may be performed using any type of material deposition technique, including but not limited to ALD, chemical vapor deposition (CVD), and physical vapor deposition (PVD). The techniques for forming these stacked layers is well documented elsewhere and, thus, will not be described in detail herein.

A gate dielectric, such as a high-k dielectric 106 (e.g., labeled as "High K" in the legend, sometimes referred to as a high-k material, structure, or layer), may be formed on the side of the epi 102. The high-k dielectric 106 can be grown such that a predetermined amount of high-K dielectric 106 is formed at a portion of the epi 102. The high-k dielectric 106 may be grown to create a predetermined separation distance between (e.g., interposing between) a gate material 108 (e.g., shown as "Metal Gate" in the legend) and the epi 102. As shown, the high-k dielectric 106 can form on the outer side of the epi 102 opposite from the core region.

The gate material 108 can be formed on the side of the high-k dielectric 106, such that the high-k dielectric 106 separates the gate material 108 from the epi 102. The portion of the epi 102 surrounded by the high-k dielectric 106 and the gate material 108 can be a channel connecting the first S/D structure to the second S/D structure of the epi 102. As shown, the source can correspond to the bottom portion of the epi 102 and the drain can correspond to the top portion of the epi 102. Alternatively, the drain and source can correspond to the bottom portion and top portion of the epi 102, respectively. Hereinafter, the described process for forming, depositing, growing, etching, removing, or replacing materials can be applied to one of the transistors or both of the transistors (e.g., the left and/or the right transistors) formed on the substrate.

Figure 3:
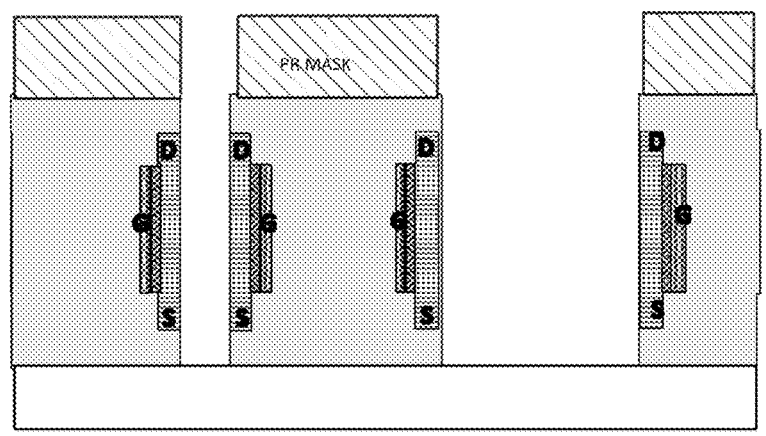

FIG. 3 illustrates a cross-sectional view of the device shown in the next stage of the example process Flow A. Once the transistor, including at least the semiconductor shell and the core region, has been constructed using material deposition techniques, the process flow proceeds to the next stage. To start lining the core region with metal lining, one or more channels (sometimes referred to as a canal, "transistor body openings," or tunnel of the transistor body) may be formed. To form the channels through the dielectric material 104, a mask (e.g., of a photoresist (PR) or other suitable masking material) may be formed with openings that define the x-y cross-section of the channels. The opening that defines the x-y cross-section of the channels can be formed at portion 201A and/or 201B of the device, for example. The opening can be formed as a circle, among other shapes, from the top of the dielectric material 104 to at least a bottom portion of the core region of the transistor (e.g., beyond the core region surrounded by the semiconductor shell). In some cases, the opening can be formed to the substrate, which the dielectric material 104 may be deposited such that the substrate is not exposed within the opening, for example. In some cases, the channel can extend up to an intermediate (e.g., midsection) between the semiconductor shell and the substrate. One or more etch techniques may be performed to remove the portion of the underlying materials aligned with the opening in the mask to form the transistor body opening. Any type of suitable etching techniques may be used, including but not limited to dry etching, wet etching, or plasma etching techniques. The mask may be removed once the channel openings are defined or may be retained to protect the underlying surface or to remain as part of the final structure. Hereinafter, to form an opening through one or more described materials, one or masks and etching techniques can be used as discussed above.

FIG. 4 illustrates a cross-sectional view of the device shown in the next stage of the example process Flow A. Once the channel opening(s) are defined, a metal material 112 (e.g., shown as "Vertical Routing Metal" in the legend) can be deposited or formed within the opening. The metal material 112 (among other metal materials) can be any type of conductive metal suitable to electrically connect with other conductive metals (e.g., epi 102), including copper, gold, silver, platinum, nickel, tungsten, ruthenium, or other types of conductive metals or alloys. As shown, the metal material 112 may not be in contact with the substrate (e.g., separated by the dielectric material 104).

FIG. 5 illustrates a cross-sectional view of the device shown in the next stage of the example process Flow A. Subsequent to depositing the metal material 112, the metal material 112 can be etched. The etching process may be a selective etching process that etches the metal material 112 to create the opening within the core region of the semiconductor shell, by etching the metal material 112 by a predetermined amount. As shown in FIG. 5, the metal material 112 can be etched such that the metal material 112 remains in electrical contact with a portion of the epi 102 corresponding to one of the first S/D structure or the second S/D structure. The metal material 112 may not be in contact with a portion of the epi 102 corresponding to the conductive channel of the gate material 108.

FIG. 6 illustrates a cross-sectional view of the device shown in the next stage of the example process Flow A. After etching the metal material 112, a dielectric material 110 (e.g., shown as "Dielectric 3" in the legend) is deposited into the opening or the core region of the transistor. The dielectric material 110 may sometimes be referred to as a dielectric core of the transistor.

FIG. 7 illustrates a cross-sectional view of the device shown in the next stage of the example process Flow A. Once the dielectric material 110 is deposited, various openings can be formed using one or more masks and etching processes. For example, an opening is formed from the top of the dielectric material 104 to a portion of the gate material 108. Another opening is formed from the top of the dielectric material 104 to one of the first S/D structure or the second S/D structure opposite of the S/D structure in electrical contact with the metal material 112 (e.g., a first metal structure). Further, another opening is formed from the top of the dielectric material 110 to the metal material 112, thereby exposing the first metal structure in the opening. Hence, source contact (or other metal routings) can be obtained, deposited, or occupied in the openings. The x-y cross-section (e.g., size of the opening) can be predetermined, such that additional materials can be deposited and surrounded by the respective dielectric materials (e.g., dielectric material 104 or dielectric material 110) or isolation layers, and in contact with desired metal structure (e.g. source/drain structure or gate structure).

Figure 8:
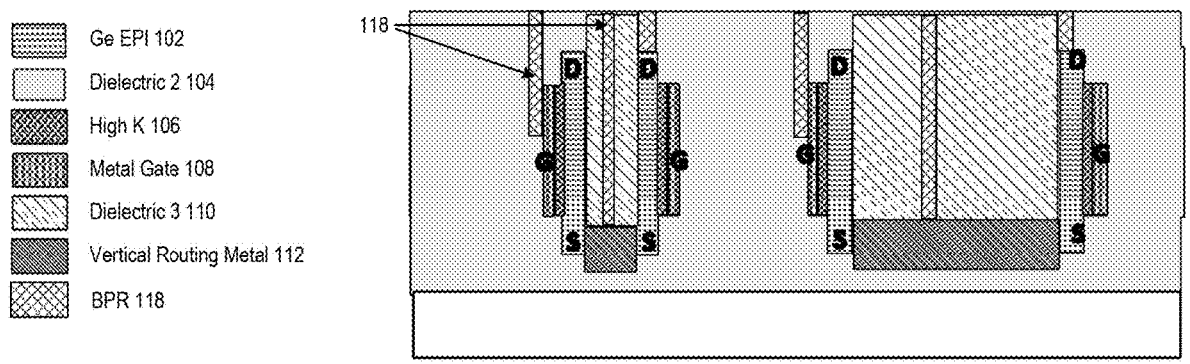

FIG. 8 illustrates a cross-sectional view of the device shown in the next stage of the example process Flow A. Once the openings are formed or defined, one or more metal structures 118 (e.g., shown as "BPR" (buried power rail) in the legend) can be deposited within the opening. The metal structures 118 may be referred to as a second metal structure, a third metal structure, etc. in addition to the first metal structure deposited at the lower portion of the core region. For example, from the left to the right openings as shown in FIG. 8, a second metal structure can be deposited in the opening exposing the gate material 108, such that the second metal structure is in electrical contact with the gate material 108. Further, a third metal structure can be deposited in the opening exposing the first metal structure, such that, in this example, the source in electrical contact with the first metal structure can be vertically routed to the top of the dielectric material 110. Additionally, a fourth metal structure can be deposited in the opening exposing the drain, such that the fourth metal structure can be in electrical contact with the drain. The metal structures (e.g., the first, second, third, and fourth metal structures) can extend along the vertical direction. With the layout presented in at least FIG. 8, the source, drain, and/or gate electrode connection can have optimum layout efficiency. Hence, the inner portion of the dielectric material 110 can be utilized for any fabrication sequence of a vertical transistor.

FIGS. 9-26 illustrate cross-sectional views of a process for Flow B to form a semiconductor device including vertical transistors using the inner metal core to allow connection to gate electrode region. Each of the FIGS. 9-26 generally refer to one or more process steps in a process flow of Flow B, each of which are described in detail in connection with the respective Figure. One or more processes of Flow B can be similar to one or more processes of at least Flow A as discussed herein, for example.

Figure 9:
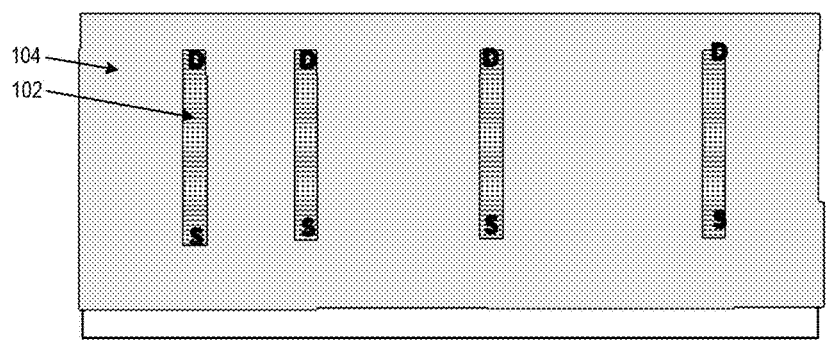

FIG. 9 illustrates a cross-sectional view of a device including two semiconductor shells formed above the substrate. The semiconductor shell (e.g., of a first transistor) can include at least a first S/D structure and a second S/D structure. Another semiconductor shell (e.g., of a second transistor) can include a third S/D structure and a fourth S/D structure. For example, the left semiconductor shell of FIG. 9 (among other Figures herein) can correspond to the first transistor and the right semiconductor shell can correspond to the second transistor.

Figure 10:
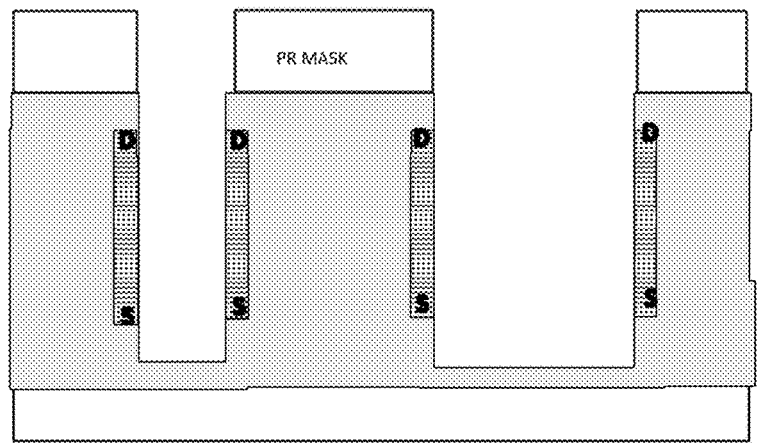

FIG. 10 illustrates a cross-sectional view of the device shown in the next stage of the example process Flow B. The core region of the transistor can be etched using one or more masks and at least one etching process. As a result, an opening is formed for the core region of the transistor (e.g., the first and second transistors). The opening can extend in the vertical direction (e.g., z-direction) from the top of the dielectric material 104 to the bottom portion of the core region (e.g., at or below the portion of the core region surrounded by the bottom S/D structure of the semiconductor shell). The opening may not extend to the substrate, such that the bottom portion of the opening separates from the substrate by the dielectric material 104.

FIG. 11 illustrates a cross-sectional view of the device shown in the next stage of the example process Flow B. Once the opening has been formed, the metal material 112 can be deposited within the opening using at least one of the material deposition techniques. FIG. 12 illustrates a cross-sectional view of the device shown in the next stage of the example process Flow B. Subsequent to depositing the metal material 112, the metal material 112 can be vertically etched to reduce the height (e.g., in the z-direction). The metal material 112 can be etched using at least one of the etching techniques, such as described herein. As shown, this metal material 112 is etched to be in electrical connection with one of the S/D structures (e.g., first or second S/D structure for the first transistor or third or fourth S/D structure for the second transistor). For the purposes of example, and as shown in FIG. 11, the metal material 112 can be etched to only contact the source structure of the epi 102.

Figure 13:
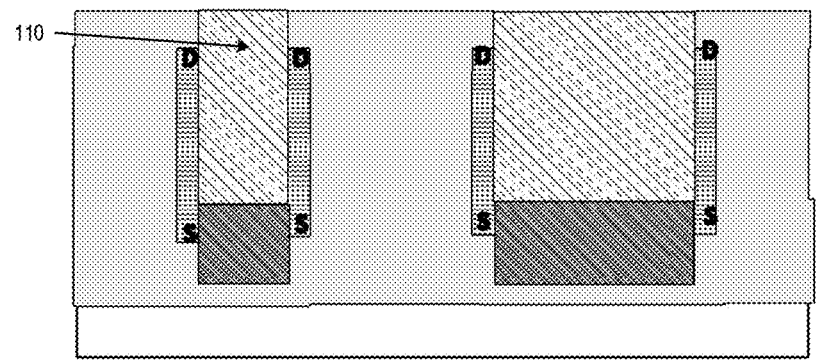

FIG. 13 illustrates a cross-sectional view of the device shown in the next stage of the example process Flow B. After etching back the metal material 112 (e.g, first metal structure/material), the dielectric material 110 can be deposited into the opening. At this process, the dielectric material 110 can be deposited or formed above the first metal structure to the top of the dielectric material 104. The dielectric material 110 can be deposited using at least one of the material deposition techniques.

Figure 14:
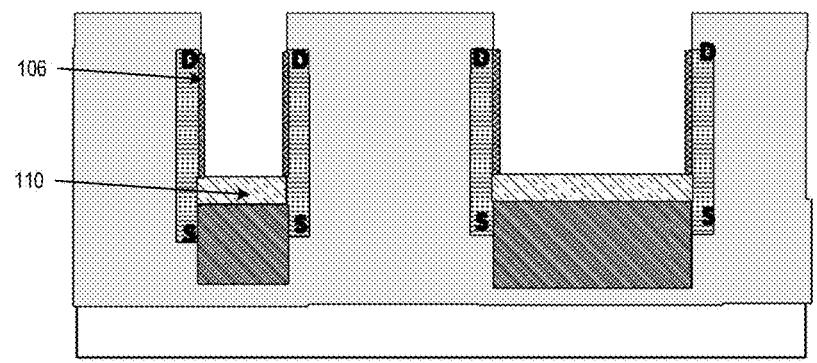

FIG. 14 illustrates a cross-sectional view of the device shown in the next stage of the example process Flow B. The deposited dielectric material 110 can be etched using at least one of the etching techniques. The dielectric material 110 can be etched from the top of the dielectric material 104 to a predetermined height above the first metal structure. As such, the dielectric material 110 can extend in the vertical direction from at least the top of the first metal structure (e.g., a height surrounded by a portion of the epi 102 corresponding to the source or the conductive channel).

Subsequent to etching the dielectric material 110, the high-k dielectric 106 can be selectively deposited or lined within the opening. For example, the high-k dielectric 106 can be formed or grown around the inner portion of the semiconductor shell (e.g., the inner portion of the epi 102). The high-k dielectric 106 can be grown with a predetermined thickness, such as to separate a gate material (among other materials) from the epi 102. As shown, the high-k dielectric 106 can be extended in the vertical direction from the dielectric material 110 to at least an upper portion of the epi 102, which can correspond to the drain structure. Hence, the high-k dielectric 106 can separate at least the conductive channel and drain structure portion of the epi 102 from the opening.

In some implementations, a portion of the epi 102 can be etched, such that the high-k dielectric 106 can be formed as part of the semiconductor shell. In this case, the channel opening can retain the same size in the x-y direction. Otherwise, by lining the inner wall of the semiconductor shell corresponding to the epi 102, the size of the channel opening in the x-y direction (at least at the portion surrounded by the high-k dielectric 106) is reduced.

FIG. 15 illustrates a cross-sectional view of the device shown in the next stage of the example process Flow B. Upon depositing the high-k dielectric 106, the gate material 108 is deposited within the opening. The deposition of the gate material 108 can be performed by at least one of the material deposition techniques.

FIG. 16 illustrates a cross-sectional view of the device shown in the next stage of the example process Flow B. Once the gate material 108 is deposited, the gate material 108 is etched using at least one of the etching techniques. The gate material 108 can be etched to a predetermined vertical height to define the gate electrode. The conductive channel of the gate can correspond to at least the portion of the epi 102 surrounding the gate material 108 (e.g., separated by the interposing high-k dielectric 106).

FIG. 17 illustrates a cross-sectional view of the device shown in the next stage of the example process Flow B. Once the gate material 108 is formed, the dielectric material 116 (e.g., shown as "Dielectric 4" in the legend) can be formed within the opening above the gate material 108. The dielectric material 116 can be deposited using at least one of the material deposition techniques. The core region or center region of the dielectric material 116 can be etched using at least one of the etching techniques. By this etching process, another opening can be formed within the dielectric material 116. The opening can include a predetermined size in the x-y direction, extending from the top of the dielectric material 116 or the dielectric material 104 to expose the metal material 108.

FIG. 18 illustrates a cross-sectional view of the device shown in the next stage of the example process Flow B. Further from etching the dielectric material 116, the gate material 108 can be etched. The gate material 108 can be etched to form the same channel opening as the etching of the dielectric material 116, thereby having the same opening size in the x-y direction. Accordingly, the channel opening can extend in the vertical direction from the top of the dielectric material 104 to the dielectric material 110 (e.g., exposing the top of the dielectric material 110).

Figure 19:
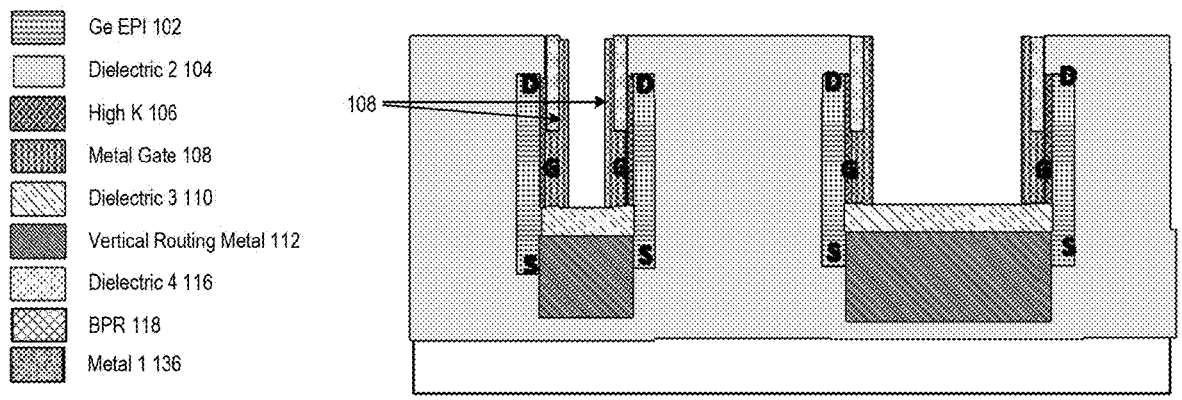

FIG. 19 illustrates a cross-sectional view of the device shown in the next stage of the example process Flow B. Once the gate material 108 and the dielectric material 116 are etched, the additional gate material 108 can be lined or deposited within the opening defined by the dielectric material 116 and the gate material 108. The gate material 108 can be lined by using at least one of the material deposition techniques or material lining techniques. As a result the gate material 108 (e.g., gate structure) can include a portion that extends along a vertical direction beyond the top of the semiconductor shell (e.g., from the top of the dielectric material 116 to the top of the dielectric material 110). The thickness of the gate material 108 linings can be predetermined. As shown, the channel opening can be surrounded by the gate material 108.

Figure 20:
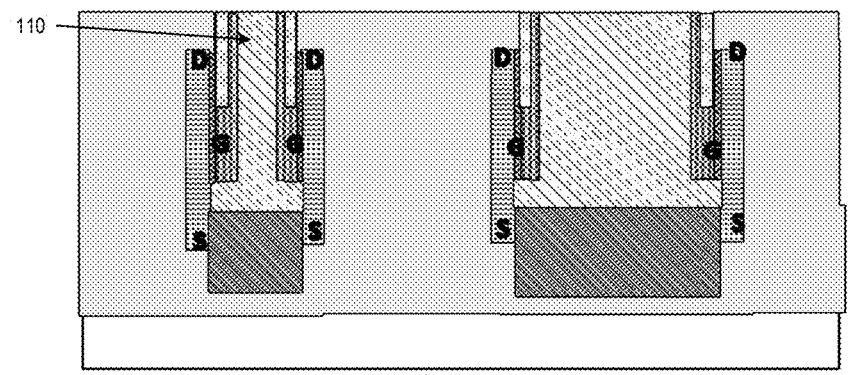
Figures 21, 22:
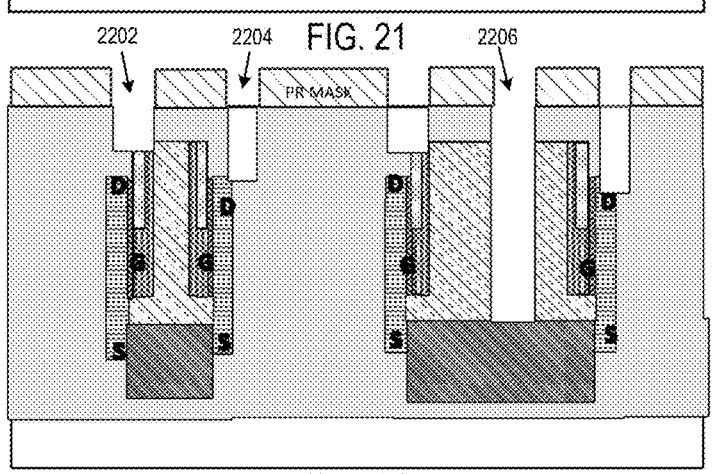

FIG. 20 illustrates a cross-sectional view of the device shown in the next stage of the example process Flow B. Once the gate material 108 is lined, the dielectric material 110 can be deposited within the channel opening (e.g., the remaining un-filled portion of the transistor). FIG. 21 illustrates a cross-sectional view of the device shown in the next stage of the example process Flow B. After depositing the dielectric material 110, the dielectric material 104 can be deposited above the transistor (e.g., capping or encapsulating the transistor within the dielectric material 104).

FIG. 22 illustrates a cross-sectional view of the device shown in the next stage of the example process Flow B. Subsequent to depositing the dielectric material 104 to cap the transistor, various channel openings can be formed using one or more masks and etching techniques. For example, an opening can be formed from the top of the dielectric material 104 to the gate material 108 (e.g., shown as portion 2202). Further, another opening can be formed from the top of the dielectric material 104 to at least a portion of one of the first S/D structure or the second S/D structure. As shown, for example, this opening can be formed extending vertically to a portion of the drain (e.g., shown as portion 2204). A similar masking and etching process can be applied to the second transistor. Additionally or alternatively, such as shown in the second transistor, an additional channel opening can be formed in the core region of the dielectric material 110, extending from the top of the dielectric material 104 to the metal material 112 (e.g., first metal structure), such as shown at portion 2206 of FIG. 22.

Figure 23:
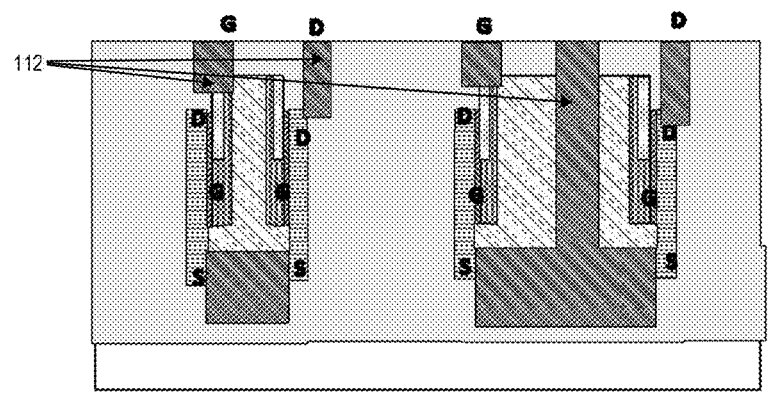

FIG. 23 illustrates a cross-sectional view of the device shown in the next stage of the example process Flow B. Once the channel openings of FIG. 22 are formed, one or more metal materials 112 can be deposited into the channel opening (e.g., similar deposition process as shown in FIG. 8). At this stage of the process, the deposited metal materials 112 may be referred to as a second, third, fourth, etc. metal structure. For example, a deposited second metal structure can be in electrical contact with the gate material 108 at portion 2202. A deposited third metal structure can be in electrical contact with one of the first S/D structure or the second S/D structure. As shown for the first transistor, the third metal structure can be in electrical contact with the drain structure at portion 2204. Further, a deposited fourth metal structure (e.g., for the second transistor) can be in electrical contact with the source structure at portion 2206, extending from the top of the dielectric material 104 to the first metal structure. Hence, the fourth metal structure can be electrically connected to the first metal structure can be in electrical contact with the source structure.

Figure 24:
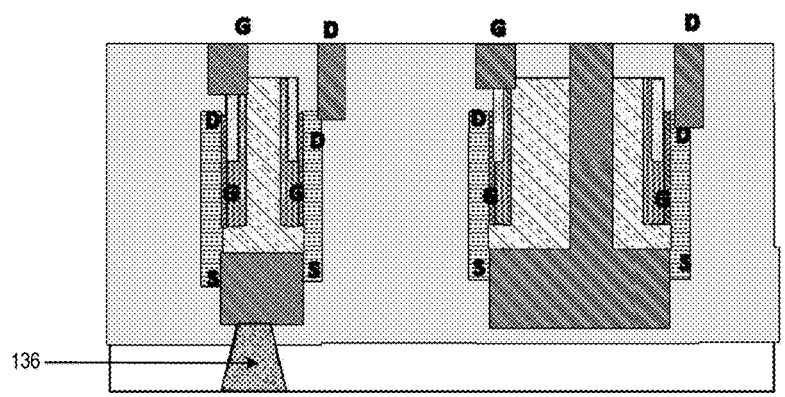

FIG. 24 illustrates a cross-sectional view of the device shown in the next stage of the example process Flow B. Once the metal structures are formed in connection with the first S/D structure, the second S/D structure, and/or the gate structure, a metal material 136 (e.g., shown as "Metal 1" in the legend) can be formed or added. In some implementations, the metal material 136 can represent a through-silicon via (TSV) extending from the bottom of the substrate to the first metal structure, such as for connection to the S/D structure (e.g., source connection).

Figure 25:
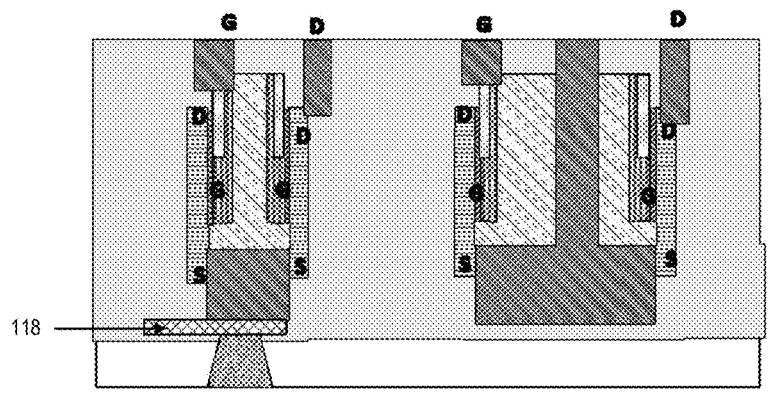

FIG. 25 illustrates a cross-sectional view of the device shown in the next stage of the example process Flow B. Prior to the metal material 136 is formed, a metal material 118 can be formed or deposited at the bottom of the first metal structure. The metal material 118 can be extended in a horizontal direction, to be in electrical contact with a portion of the bottom of the first metal structure to another portion of the dielectric 104. As shown, the metal material 118 is extended such that the edge of the metal material 118 opposite from contact with the first metal structure is positioned away from the semiconductor shell (e.g., extends further from the sides of the semiconductor shell). In some implementations, the metal material 118 can function as a power rail (e.g., a BPR) configured to deliver a power supply voltage.

Figure 26:
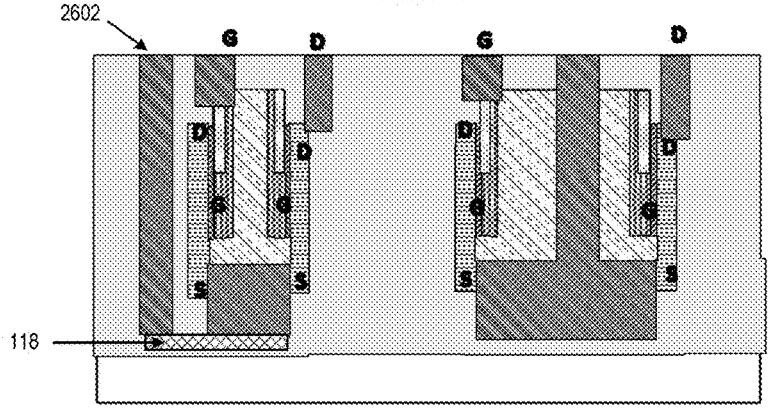

FIG. 26 illustrates a cross-sectional view of the device shown in the next stage of the example process Flow B. Subsequent to forming the metal material 118, the metal material 118 can be vertically routed to the top of the dielectric material 104. For example, a portion 2602 of the dielectric material 104 can be edged using a mask and an etching technique, extending in the vertical direction from the top of the dielectric material 104 to the metal material 118. Once the opening is formed from this etching process, the metal material 112 (or other metal materials) can be deposited into the opening. This deposited metal material 112 can correspond to a fifth metal structure in contact with the metal material 118. Hence, the source connection can be established, such as routing from the first metal structure to the metal material 118, and from the metal material 118 to the fifth metal structure.

FIGS. 27-40 illustrate cross-sectional views of a process for Flow C to form a semiconductor device including vertical NMOS and PMOS transistors. Each of the FIGS. 27-40 generally refer to one or more process steps in a process flow of Flow C, each of which are described in detail in connection with the respective Figure. One or more processes of Flow C can be similar to one or more processes of at least Flow A and/or Flow B as discussed herein, for example.

Figure 27:
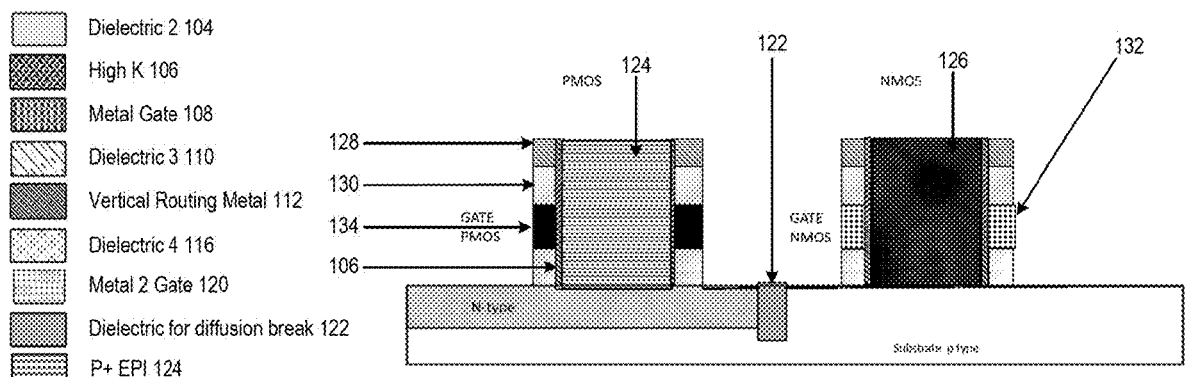
FIGS. 27-40 illustrate cross-sectional views of a process for Flow C to form a semiconductor device including vertical NMOS and PMOS transistors, according to an embodiment.

FIG. 27 illustrates a cross-sectional view of the device including completed NMOS and PMOS transistors. For example, the PMOS transistor can correspond to a first transistor shown to the left and the NMOS transistor can correspond to a second transistor shown to the right. The steps discussed herein can be applied similarly for both the first and second transistors. Certain steps may be applied differently between the two transistors (e.g., certain etching, deposition, or lining processes).

Still referring to FIG. 27, the transistor can be formed on top of the substrate. The first transistor can be formed on top of a first type of substrate (e.g., N-type substrate) and the second transistor can be formed on top of a second type of substrate (e.g., P-type substrate). A dielectric material 122

(e.g., shown as "Dielectric for diffusion break" in the legend) can be formed at the edge of the N-type substrate, interposing between a portion of the N-type substrate and the P-type substrate. The semiconductor shell of the first transistor can include at least a gate material 134 (e.g., shown as "Metal 2" in the legend) vertically interposed between dielectric materials 130 (e.g., shown as "Dielectric 1" in the legend), and a capping layer 128 above the top dielectric material 130 (e.g., capping the gate structure). The gate material 134 can correspond to a first gate structure (e.g., for p-type FET or PMOS in FIG. 27). The semiconductor shell of the second transistor can include similar materials or structures as the first transistor, with gate material 132 (e.g., shown as "Metal 1" in the legend) corresponding to a second gate structure (e.g., for n-type FET or NMOS in FIG. 27).

The high-k dielectric 106 can be formed on the inner side of the respective gate structure (e.g., the first and second gate structures). The high-k dielectric 106 can separate the semiconductor shell from the core region. The core region can be occupied by a respective epi material of the different types of FET. For instance, the first transistor can include epi 124 (e.g., shown as "P+ EPI" in the legend) occupying the core region configured for a PMOS. The second transistor can include epi 126 (e.g., shown as "N+ EPI" in the legend) occupying the core region configured for an NMOS. Hereinafter, the described process for forming, depositing, growing, etching, removing, or replacing materials can be applied to one of or both of the transistors. For example, etching the epi 124 may include etching of the epi 126, or depositing materials to contact the gate material 134 can include depositing materials to contact the gate material 132. Certain other processes described herein can be different between the two transistors, such as illustrated in the Figures.

Figure 28:
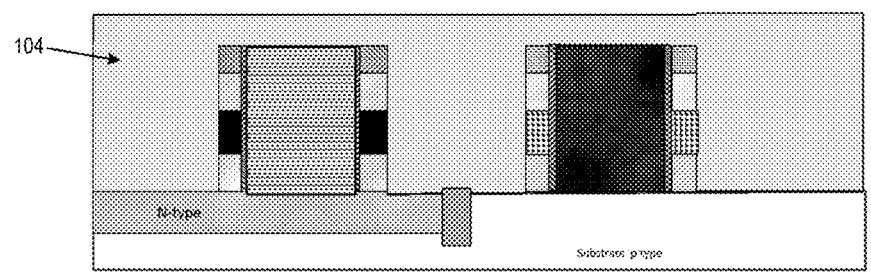
Figure 29:
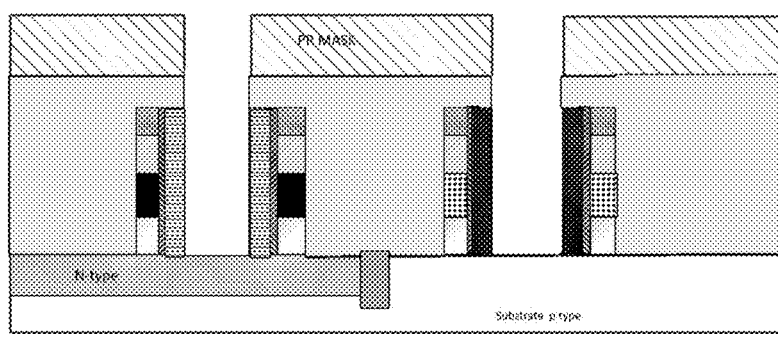

FIG. 28 illustrates a cross-sectional view of the device shown in the next stage of the example process Flow C. The dielectric material 104 can be deposited to cover (e.g., surround, top, and/or submerge) the transistors. The dielectric material 104 can be polished using a polishing technique, such as chemical mechanical polishing (CMP). FIG. 29 illustrates a cross-sectional view of the device shown in the next stage of the example process Flow C. A channel opening can be formed through the core region of the semiconductor shell using one or more masks and an etching technique. As shown, the epi 124 and the epi 126 can be a part of the semiconductor shell, including at least a first S/D structure and a second S/D structure of the first transistor and a third S/D structure and a fourth S/D structure of the second transistor. A portion of the epi 124 and epi 126 corresponding to the gate material 134 and gate material 132, respectively, can include a conductive channel extending vertically between the S/D structures. For the purposes of simplicity, and for example, the bottom portion of the epi 124 can correspond to the first S/D structure, and the top portion of the epi 124 can correspond to the second S/D structure. Further, the bottom portion of the epi 126 can correspond to the third S/D structure, and the top portion of the epi 126 can correspond to the fourth S/D structure.

Figure 30:
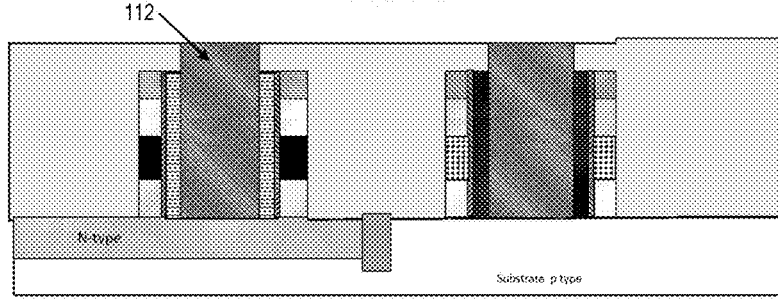

FIG. 30 illustrates a cross-sectional view of the device shown in the next stage of the example process Flow C. Once the opening has been formed, the metal material 112 can be deposited into the opening. At this stage, the metal material 112 can extend vertically from the top of the dielectric material 104 to the substrate of the respective transistor.

Figure 31:
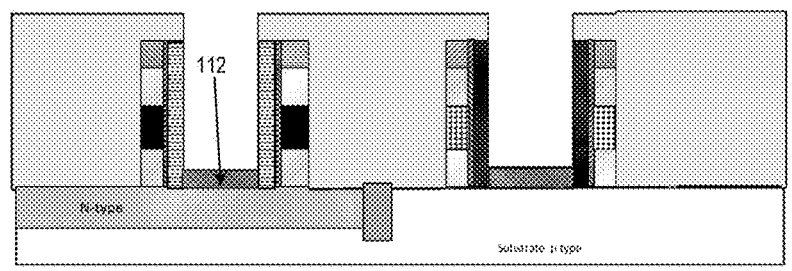

FIG. 31 illustrates a cross-sectional view of the device shown in the next stage of the example process Flow C. The metal material 112 can be etched using at least one of the etching techniques. The metal material 112 can be etched to a predetermined height, such that the metal material 112 is connected to one of the S/D structures. As shown, the metal material 112 of the first transistor (e.g., a first metal structure) is electrically connected to the first S/D structure and the metal material 112 of the second transistor (e.g., a second metal structure) is electrically connected to the third S/D structure.

Figure 32:
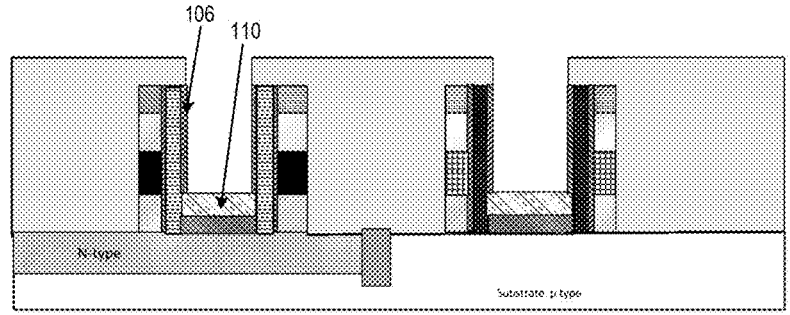

FIG. 32 illustrates a cross-sectional view of the device shown in the next stage of the example process Flow C. Subsequent to etching the metal material 112, the dielectric material 110 can be deposited, followed by another high-k dielectric 106 formed on the inner portion of the semiconductor shell above the dielectric material 110. This high-k dielectric 106 can extend vertically from a portion of the gate material 134 (and/or gate material 132) to the capping layer 128. The dielectric material 110 and the high-k dielectric 106 can be deposited using similar techniques or processes described in conjunction with FIG. 14, for example.

Figure 33:
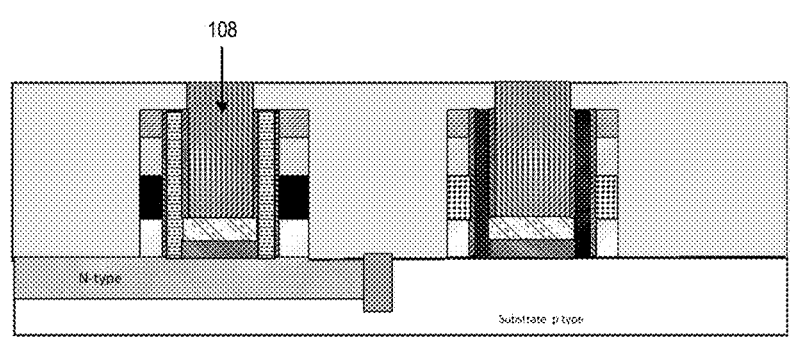

FIG. 33 illustrates a cross-sectional view of the device shown in the next stage of the example process Flow C. Within the channel opening surrounded by the high-k dielectric 106 and above the dielectric material 110, the gate material 108 can be deposited within the opening of the first and/or the second transistors. The gate material 108 can be the same as or different from the gate material 134 of the first transistor. Further, the gate material 108 can be the same as or different from the gate material 132 of the second transistor.

Figure 34:
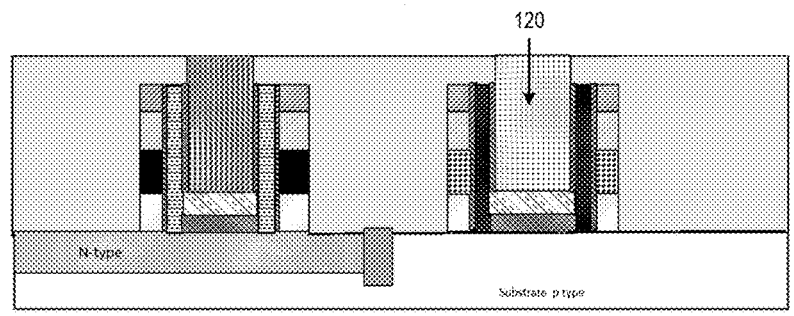

FIG. 34 illustrates a cross-sectional view of the device shown in the next stage of the example process Flow C. In some implementations, instead of the gate material 108 for the second transistor, a different gate material 120 (e.g., shown as "Metal 2 Gate" in the legend) can be deposited within the channel opening of the second transistor. The gate material 120 can be the same as or different from the gate material 132. The gate material 108 and the gate material 120 can respectively be selected for the respective type of transistor, such as the gate material 108 for PMOS and the gate material 120 for NMOS. As a result, two types of gate metals can be deposited for different transistors. For simplicity hereinafter, the gate material 108 can be deposited for both transistors.

Figure 35:
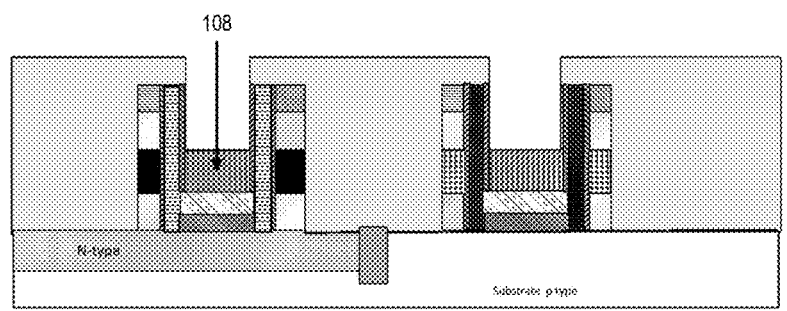
Figure 36:
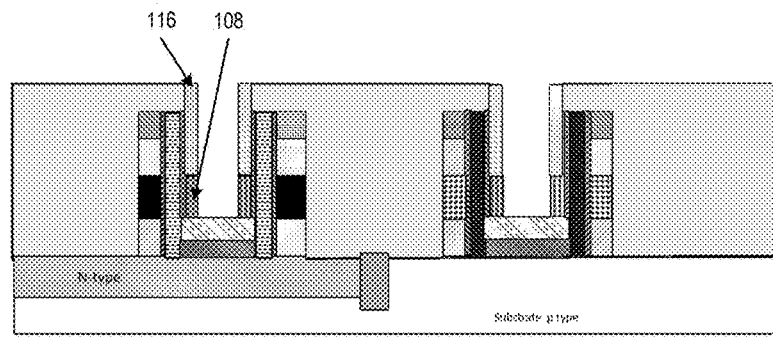

FIG. 35 illustrates a cross-sectional view of the device shown in the next stage of the example process Flow C. The gate material 108 can be etched to reduce the height using an etching technique. FIG. 36 illustrates a cross-sectional view of the device shown in the next stage of the example process Flow C. The dielectric material 116 can be deposited above the gate material 108. Subsequently, the dielectric material 116 and the gate material 108 can be etched using one or more masks and an etching technique. Etching the dielectric material 116 and the gate material 108 can form another channel opening exposing the dielectric material 110, where the opening is surrounded by the dielectric material 116 and the gate material 108. The deposition and etching techniques and processes at this stage can be similar to the processes described in conjunction with at least FIGS. 17-18, for example.

Figure 37:
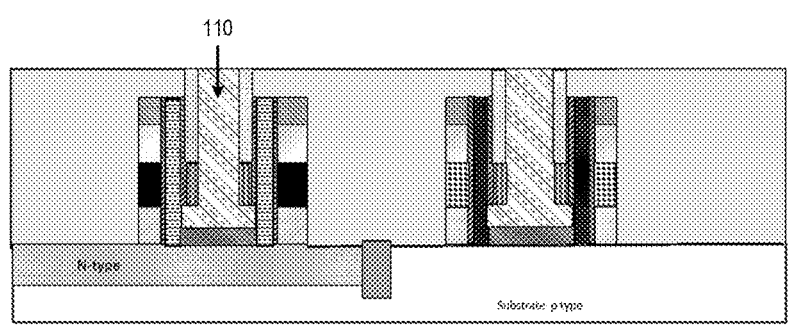

FIG. 37 illustrates a cross-sectional view of the device shown in the next stage of the example process Flow C. Once the opening is formed through the dielectric material 116 and the gate material 108, the dielectric material 116 can be deposited in the opening. Accordingly, the dielectric material 116 can extend from the top of the dielectric material 104 to the first metal structure. Subsequently, a layer of the dielectric material 104 can be deposited on top of the transistors. The deposition of the dielectric material 104 and the dielectric material 110 can be performed using any material deposition technique. Depositing the dielectric material 104 and the dielectric material 110 can be performed similarly to the processes described in at least FIGS. 20-21, for example.

Figure 38:
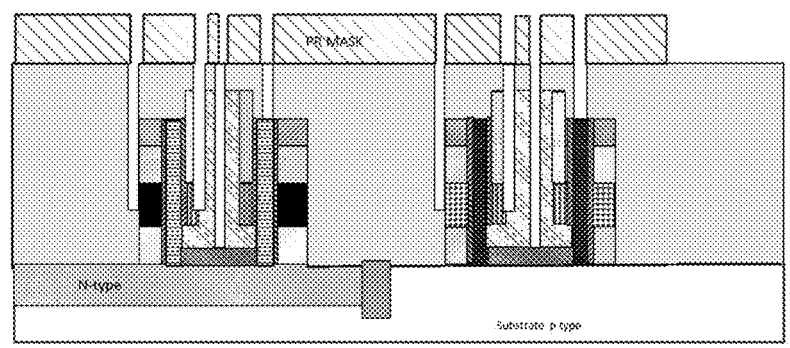

FIG. 38 illustrates a cross-sectional view of the device shown in the next stage of the example process Flow C. Subsequent to deposing the dielectric material 104, one or more masks and etching techniques can be utilized to form various channels, such as through (at least a portion of) the dielectric material 104, the dielectric material 110, the dielectric material 116, and/or the gate material 108. For example, the openings can extend from the top of the dielectric material 104 to at least the side of the gate material 134 (e.g., a first metal gate or a first gate structure) of the first transistor, the side of the gate material 132 (e.g., a second metal gate or a second gate structure) of the second transistor, the gate material 108 (e.g., a third metal gate or a third gate structure), the first metal structure (e.g., the metal material 112), and/or the top of the epis 124 and 126 (e.g., the second S/D structure and the fourth S/D structure).

Figure 39:
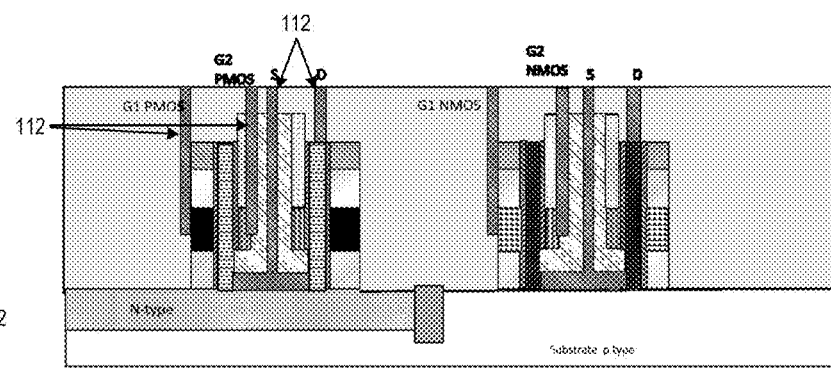
Figure 40:
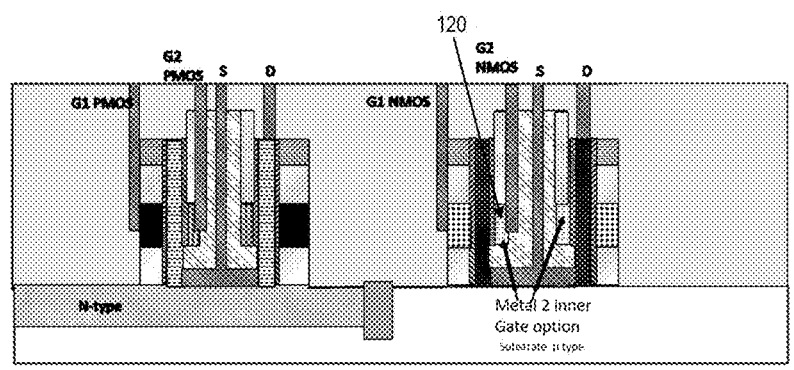
Figure 41:
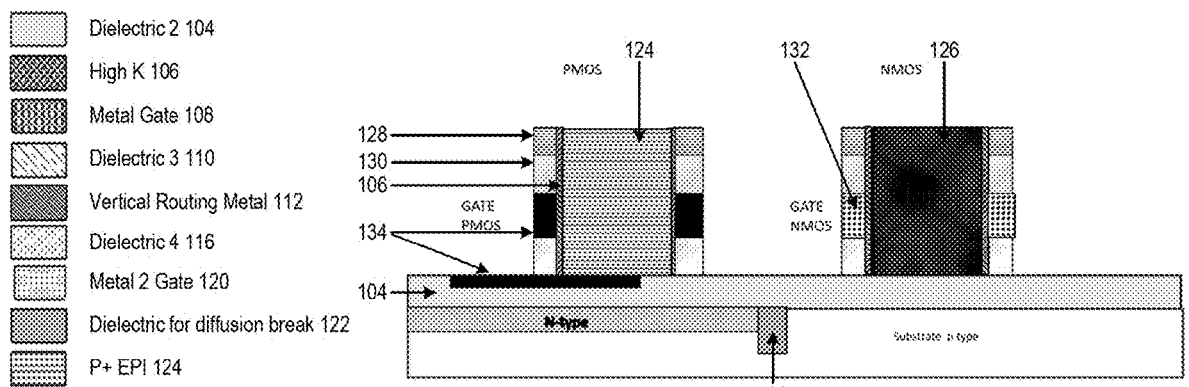
Figure 42:
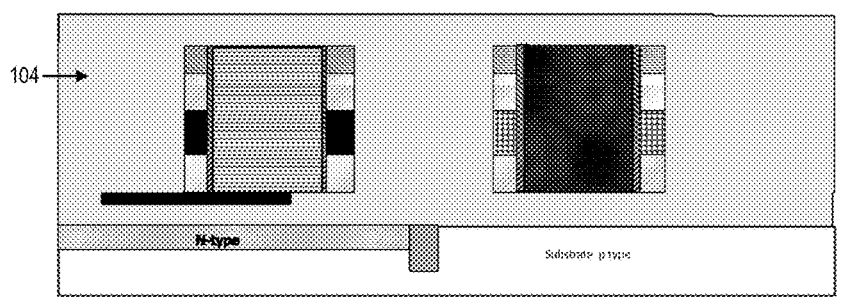
Figure 43:
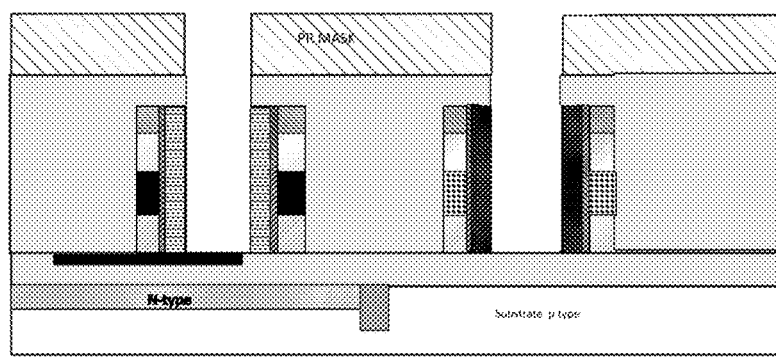
Figure 44:
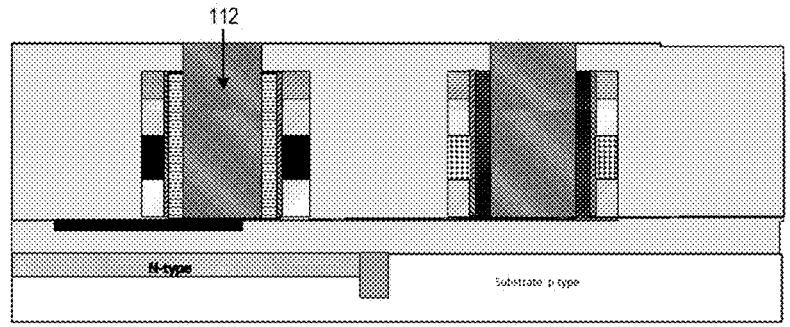

FIG. 39 illustrates a cross-sectional view of the device shown in the next stage of the example process Flow C. Once the openings are formed, metal structures can be deposited within the openings using at least one of the material deposition techniques. Although the metal material 112 is shown to be deposited in the openings, other metal materials can also be utilized for the deposition process. Accordingly, the gate structures and the S/D structures can be routed in the vertical direction to the top of the respective transistors. In some implementations, referring to FIG. 40, the gate material 120 can be utilized or formed instead of the gate material 108 for the second transistor. In some cases, the gate material 120 can be utilized instead of the gate material 108 for the first transistor. In some other cases, the gate material 120 can be selectively utilized instead of the gate material 108 for both transistors, where the gate material 120 is configured for at least one of the PMOS or NMOS, for example. Accordingly, by forming the inner and outer gate electrodes (e.g., the first and third gate structures for the first transistor or the second and third gate structures for the second transistor), the semiconductor device (e.g., CMOS in this example) can enable or allow for dual biasing of the gates.

FIGS. 41-51 illustrate cross-sectional views of a process for Flow D1 to form a semiconductor device including vertical transistors with BPR having top metal hook-up. Each of the FIGS. 41-51 generally refer to one or more process steps in a process flow of Flow D1, each of which are described in detail in connection with the respective Figure. One or more processes of Flow D1 can be similar to one or more processes of at least one of Flows A-C as discussed herein, for example. For instance, Flow D1 can be based on Flow C where NMOS and PMOS are used to describe this example process flow.

FIGS. 41-47 illustrate cross-sectional views of a device formed or constructed using one or more similar techniques as described in at least FIGS. 27-34. In addition, the transistors of FIGS. 41-47 may be separated from the substrate by the dielectric material 104 (e.g., an isolation layer formed with a predetermined thickness). Further, a metal material 134 (e.g., can be the same or different metal used to form the gate structure) can be formed below at least the first transistor, extending in a horizontal direction from below the first structure beyond (e.g., further from) the side of the semiconductor shell. In some cases, the metal material 134 can be formed below the second transistor. As such, the process of Flow D1 can continue from FIG. 34.

FIG. 48 illustrates a cross-sectional view of the device shown in the next stage of the example process Flow D1. At this stage of the process Flow D1, one or more etching and material deposition techniques can be performed similarly to the techniques discussed in at least FIGS. 35-37. However, unlike FIGS. 35-37, a channel may not be formed through the gate material 108. For example, once the gate material 108 is deposited, the gate material 108 can be etched to reduce the height. The height of the etched gate material 108 can correspond to the height of the gate material 134 or the gate material 132. In some cases, after etching, the gate material 108 can retain a height greater than other gate structures (e.g., the gate material 132 and/or gate material 134) or the height of the gate material 108 can be shorter than the other gate structures.

Figure 49:
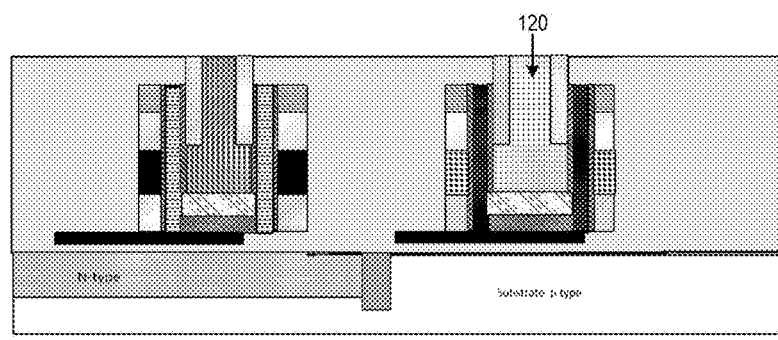

Once the gate material 108 is etched, the dielectric material 116 can be deposited using at least one material deposition technique. The dielectric material 116 can be etched using one or more masks and etching techniques to form an opening through the dielectric material 116. This opening can expose the top of the gate material 108. As shown, another portion of the dielectric material 108 can be formed by using a deposition technique in the opening. As a result, the dielectric material 108 can include a portion that extends in the vertical direction beyond the top of the semiconductor shell (e.g., the top S/D structure and/or the capping layer 128. Subsequently, the dielectric material 104 can be deposited above the transistors, similar to the techniques described in FIG. 37. In some implementations, as shown in FIG. 49, the gate material 108 can be replaced with a different gate material 120, such as shown in process Flow D1 hereinafter.

Figure 50:
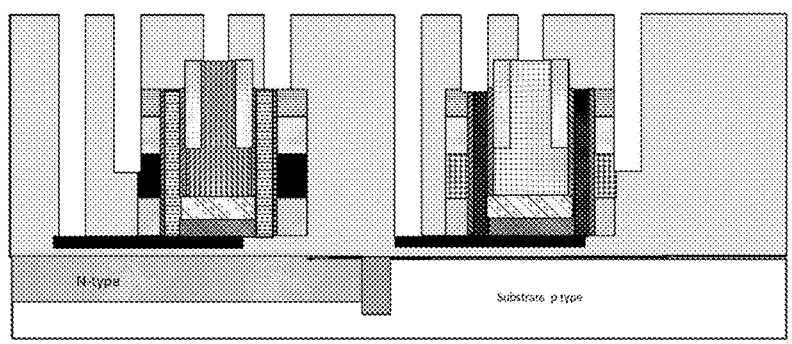

FIG. 50 illustrates a cross-sectional view of the device shown in the next stage of the example process Flow D1. Subsequent to the disposition of the dielectric material 104 above the transistors, one or more masks and etching techniques can be utilized to form the channel openings shown in FIG. 50. The channel can extend from the top of the dielectric material 104 to a predetermined or preselected portion for establishing a connection with the desired structure or material. The channel can be formed using similar techniques as described in at least FIG. 38. For example, the channel openings can be formed extending from the top of the dielectric material 104 to at least the gate materials 108, 132, and 134, and S/D structures (e.g., the first to fourth S/D structures).

FIG. 51 illustrates a cross-sectional view of the device shown in the next stage of the example process Flow D1. Once the channel openings are formed, the metal structure 136 (e.g., also shown as "Metal 1" in the legend) can be deposited into the openings using one or more material deposition techniques. Hence, the respective structures or conductive materials can be vertically routed above the dielectric material 104.

Figures 52, 53:
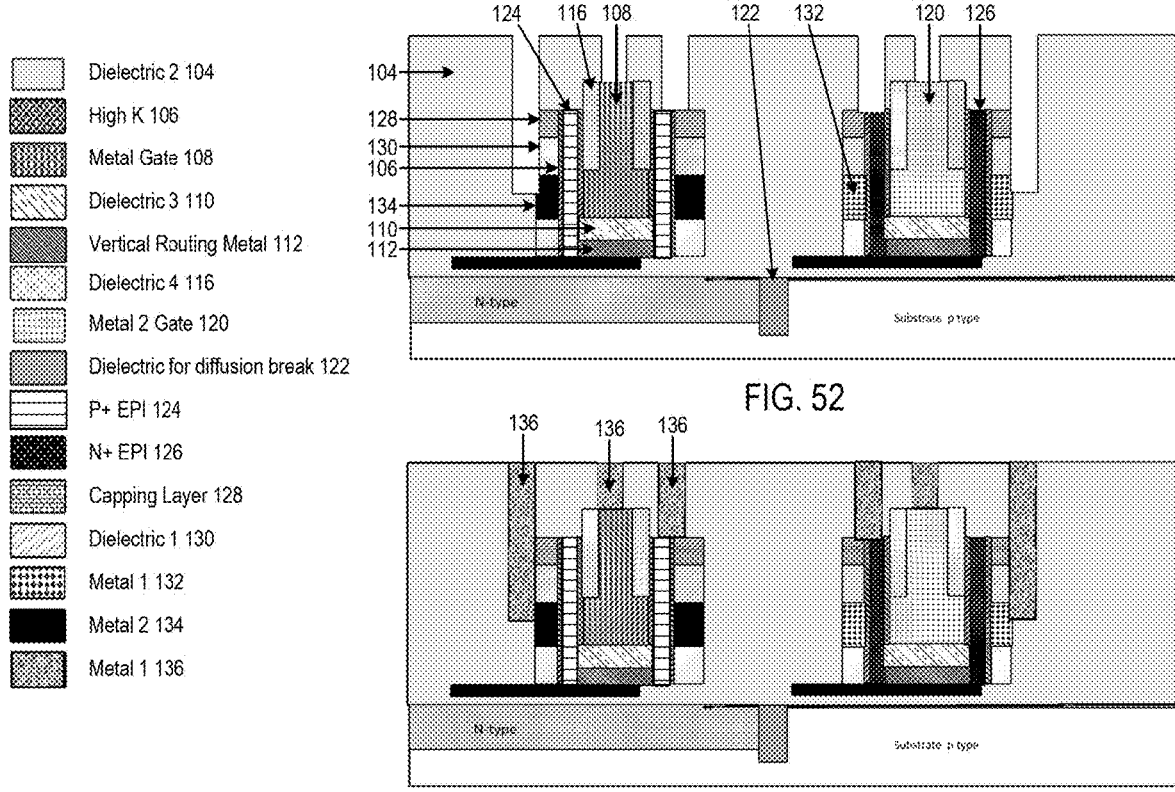
FIGS. 52-54 illustrate cross-sectional views of a process for Flow D2 to form a semiconductor device including vertical transistors with a buried power rail having a bottom substrate metal hook-up, according to an embodiment.
Figure 54:
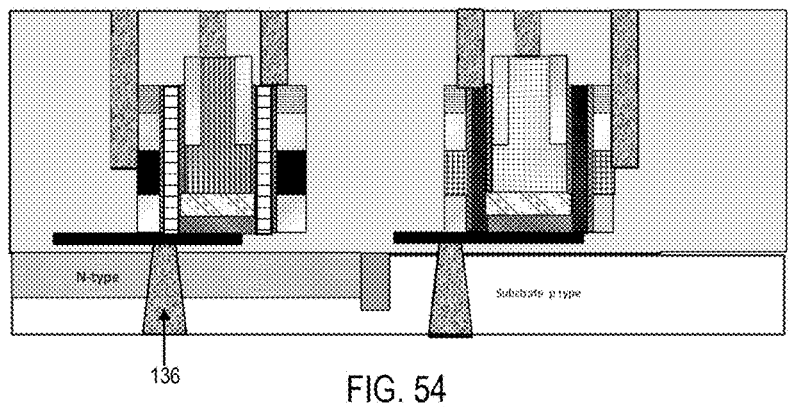

FIGS. 52-54 illustrate cross-sectional views of a process for Flow D2 to form a semiconductor device including vertical transistors with BPR having bottom substrate metal hook-up. Each of the FIGS. 52-54 generally refer to one or more process steps in a process flow of Flow D2, each of which are described in detail in connection with the respective Figure. One or more processes of Flow D2 can be similar to one or more processes of at least one of Flows A-D1 as discussed herein, for example. For instance, Flow D2 can be based on Flow C with an addition of a BPR with a bottom substrate metal hook-up. Hence, Flow D2 can modify Flow C to include a bottom BPR in the dielectric material 104 separating the transistor from the substrate.

FIG. 52 illustrates a cross-sectional view of a device formed or constructed using one or more similar techniques as described in at least Flow C or Flow D1. For example, this stage of the process Flow D2 can continue from the process described in FIG. 37 or FIG. 49. With the formation of the metal routing within the core region, channel openings can be formed using one or more masks and etching techniques (e.g., similar to the techniques performed in FIG. 50). As shown, the channel openings can extend from the top of the dielectric material 104 to the gate materials 108 and 134 of the first transistor, the gate materials 120 and 132 of the second transistor, the second S/D structure, and the fourth S/D structure (e.g., S/D structure corresponding to the top portion of the respective epis 124 and 126). Hence, the aforementioned metals can be routed in the vertical direction above the dielectric material 104.

FIG. 53 illustrates a cross-sectional view of the device shown in the next stage of the example process Flow D2.

FIG. 54 illustrates a cross-sectional view of the device shown in the next stage of the example process Flow D2. A portion of the substrate and the dielectric material 104 below the transistor can be etched using an etching technique to form a channel to the BPR of the respective transistors. The BPRs can be connected to the metal material 112 of the respective transistors, thereby being in electrical contact with the first S/D structure of the first transistor or the third S/D structure of the second transistor. The metal material 136 can be deposited in the opening from the substrate to the BPR. Hence, the first and third S/D structures can be vertically routed below the substrate.

FIGS. 55-61 illustrate cross-sectional views of a process for Flow E1 to form a semiconductor device including vertical transistors using a conformal spacer to form a source/drain and gate electrode connection with one offset spacer. Each of the FIGS. 55-61 generally refer to one or more process steps in a process flow of Flow E1, each of which are described in detail in connection with the respective Figure. One or more processes of Flow E1 can be similar to one or more processes of at least one of Flows A-D2 as discussed herein, for example. For instance, Flow E1 can be based on Flow D1 without the BPR (e.g., the metal material 134) below the transistors. The structure of FIG. 55 can be similar to the structure of FIG. 48 without the BPR. Hence, the process of Flow E1 can continue from FIG. 48 of Flow D1, for example.

FIG. 56 illustrates a cross-sectional view of the device shown in the next stage of the example process Flow E1. The gate material 108 formed using techniques described in FIG. 48 can be removed or etched from the transistors using one or more etching techniques. Further, a portion of the dielectric material 104 above the transistors can be removed, where the removed portion of the dielectric material 104 forms an opening extending between opposite ends of the epi 124 or epi 126.

Figure 57:
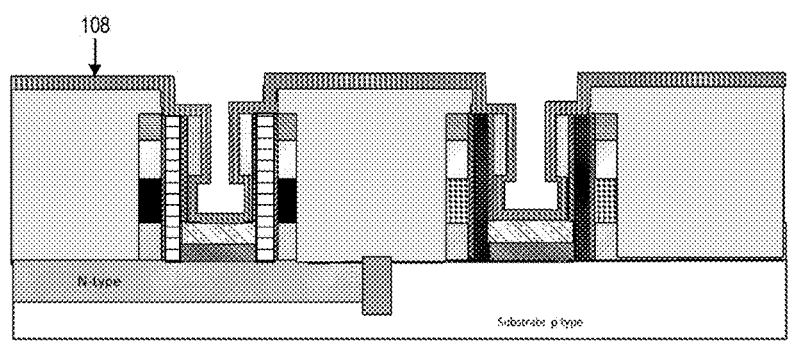

FIG. 57 illustrates a cross-sectional view of the device shown in the next stage of the example process Flow E1. Once the gate material 108 is removed from the transistor, a lining of the gate material 108 can be formed or lined along the contour of the offset structure (e.g., dielectric material 116). The gate material 108 can be formed using one or more material lining or material deposition techniques.

Figure 58:
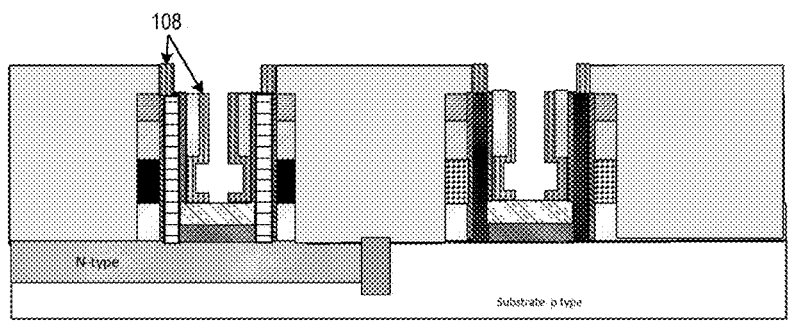

FIG. 58 illustrates a cross-sectional view of the device shown in the next stage of the example process Flow E1. Once the lining of the gate material 108 is formed, the lining of the material 108 can be etched using one or more etching techniques. As shown, the lining at the top of the dielectric material 104, at least the top of the dielectric material 116 (e.g., the offset structure), and a center region above the dielectric material 110 (e.g., above the metal material 112) can be etched. In this case, the material 108 can be a gate structure extending from the top of the semiconductor shell to the dielectric material 110 along the contour of the dielectric material 116. Further, the material 108 can be another metal structure formed concurrently to the gate structure. This metal structure formed using the material 108 can be above the epis 124 and 126, thereby being in electrical contact with the top S/D structure of the respective transistor.

Figure 59:
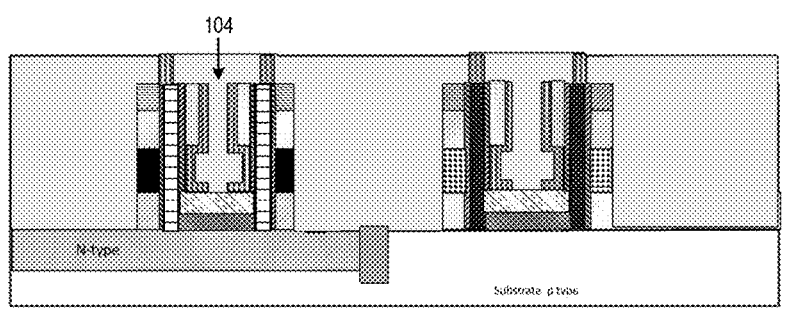
Figure 60:
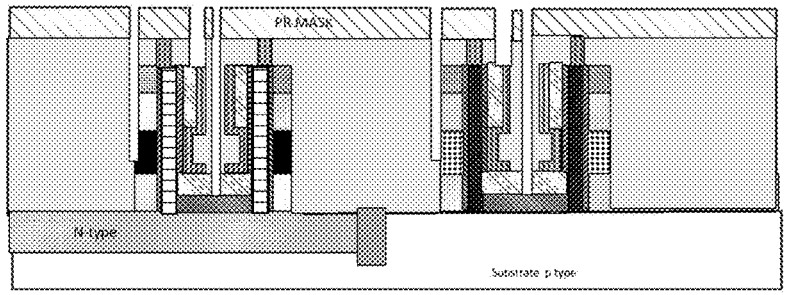

FIG. 59 illustrates a cross-sectional view of the device shown in the next stage of the example process Flow E1. Once the lining of the material 108 is etched, the dielectric material 104 can be deposited in the opening surrounded by at least the material 108. FIG. 60 illustrates a cross-sectional view of the device shown in the next stage of the example process Flow E1. One or more channel openings can be formed using one or more masks and etching techniques. The openings can be formed similarly to the openings described in conjunction with at least one of FIG. 38. For instance, the openings can extend from the top of the dielectric material 104 to at least one or more gate structures (e.g., gate materials 108, 132, and 134) and at least the bottom S/D structure in contact with the metal material 112.

Figure 61:
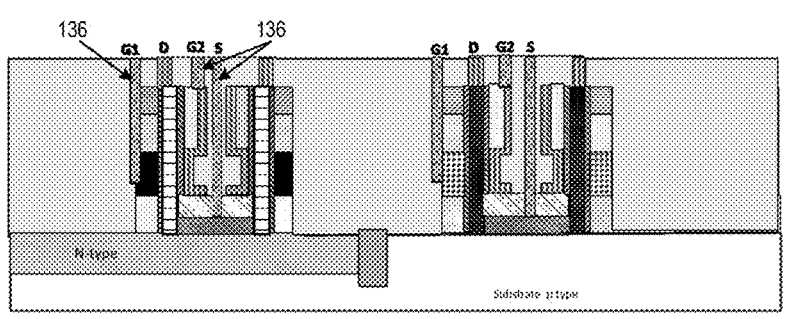

FIG. 61 illustrates a cross-sectional view of the device shown in the next stage of the example process Flow E1. Subsequent to forming the openings, the metal material 136 can be deposited in the openings to vertically route the contacts above the dielectric material 104. In this case, the metal material 108 above the epi 124 and epi 126 can route the second S/D structure and the fourth S/D structure in the vertical direction.

FIGS. 62-67 illustrate cross-sectional views of a process for Flow E2 to form a semiconductor device including vertical transistors using a conformal spacer to form a source/drain and gate electrode connection with two offset spacers. Each of the FIGS. 62-67 generally refer to one or more process steps in a process flow of Flow E2, each of which are described in detail in connection with the respective Figure. One or more processes of Flow E2 can be similar to one or more processes of at least one of Flows A-E1 as discussed herein, for example. For instance, Flow E2 can be based on Flow C with additional or alternative structure formation.

Figures 62, 63:
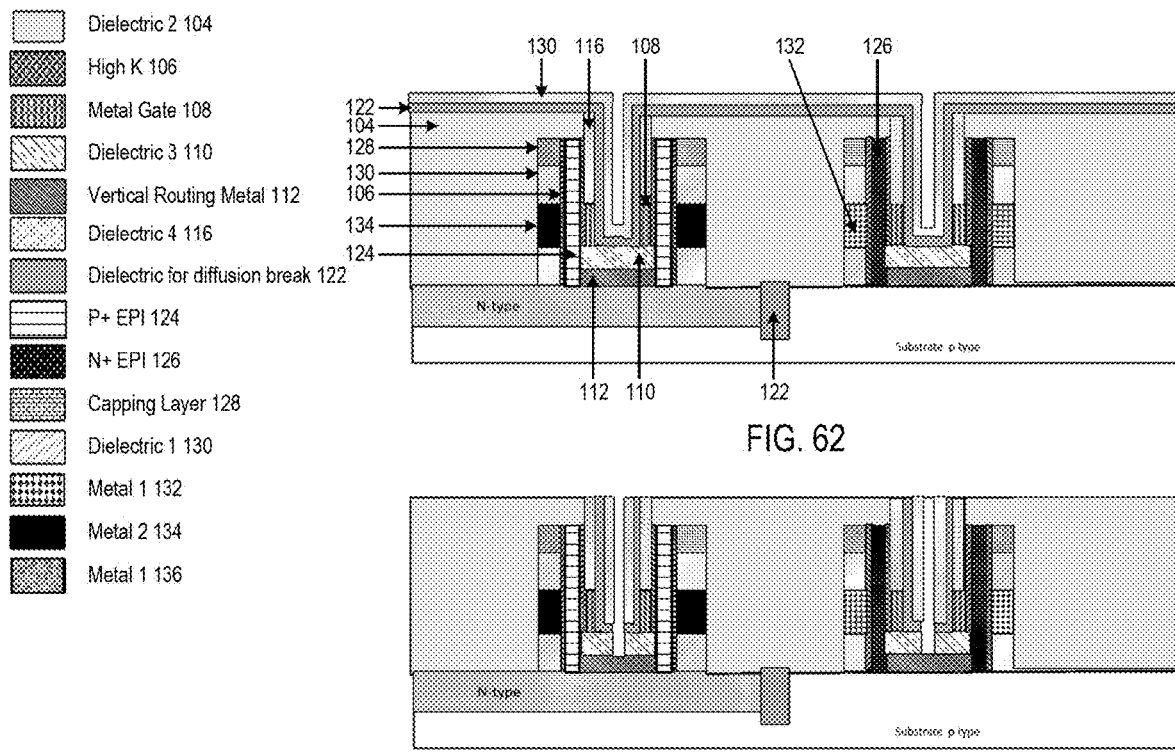
FIGS. 62-67 illustrate cross-sectional views of a process for Flow E2 to form a semiconductor device including vertical transistors using a conformal spacer to form a source/drain and gate electrode connection with two offset spacers, according to an embodiment.
Figure 64:
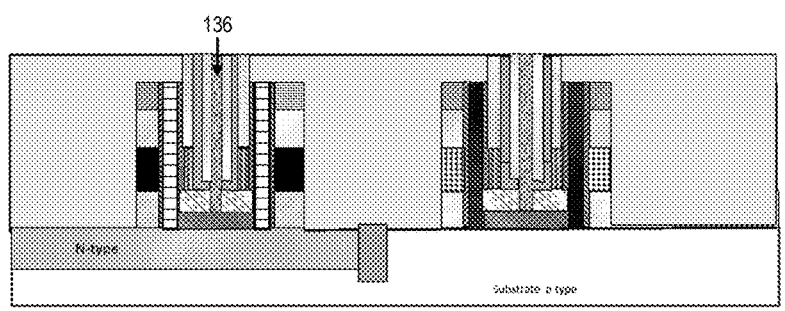

FIG. 62 illustrates a cross-sectional view of the device of process Flow E. In this stage of Flow E, the process can continue from FIG. 36 of Flow C, such that the opening can be formed through the deposited dielectric material 116 and gate material 108. Once the opening is formed, the dielectric material 122 can be lined or formed within at least the inner portion of the opening. Additionally, the dielectric material 130 can be lined topping the dielectric material 122. As shown, the dielectric material 130 can be lined in the inner portion of the dielectric material 122 lining. Hence, the remaining portion of the opening can be surrounded by the dielectric material 130. In various implementations, other dielectric materials may be used instead of at least the dielectric material 122 or the dielectric material 130, for example. The deposition, lining, or formation of the dielectric materials 122 and 130 can be performed using one or more material lining or material deposition techniques.

FIG. 63 illustrates a cross-sectional view of the device shown in the next stage of the example process Flow E2. The dielectric materials 122 and 130 can be etched to level the top of the dielectric material 104 using one or more etching techniques. Further, using one or more masks and etching techniques, a channel opening can be formed extending vertically from the top of the transistor to the metal material 112. Subsequently, referring to FIG. 64, the metal material 136 can be deposited in the opening to route the metal material 112 to the top of the transistor (e.g., providing top connection to the source in the core region of the transistor).

Figure 65:
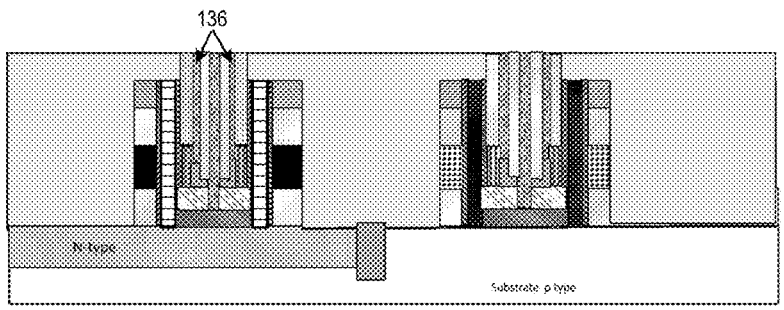

FIG. 65 illustrates a cross-sectional view of the device shown in the next stage of the example process Flow E2. To provide vertical metal routing to the gate material 108, an etching technique can be performed to etch at least a portion of the dielectric material 122 extending from the top of the transistor to a portion of the side of the gate material 108. As such, an opening can be formed to the gate material 108, and the metal material 136 can be deposited into this opening, thereby providing the gate electrode connection.

Figure 66:
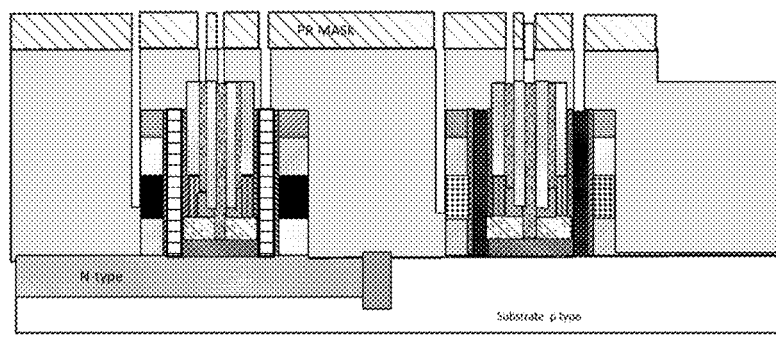

FIG. 66 illustrates a cross-sectional view of the device shown in the next stage of the example process Flow E2. The dielectric material 104 can be deposited over the transistors. Various channel openings can be formed using one or more masks and etching techniques. The channels can be formed from the top of the dielectric material 104 to the gate structures, the S/D structures, and the metal structure 136 in electrical connection with at least the gate material 108 and the metal material 112. Accordingly, referring to FIG. 67, the additional metal material 136 (or other conductive material) can be deposited into the channel openings to provide vertical routing/connection of the gate structures and the S/D structures.

Figure 67:
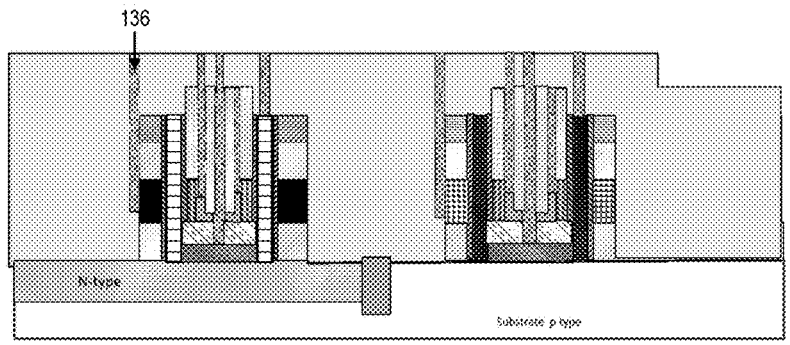
Figure 68:
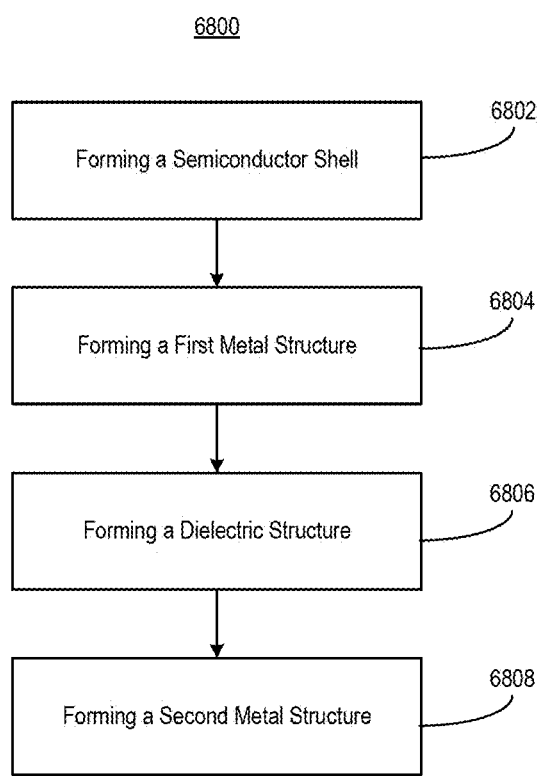
FIG. 68 illustrates a flow diagram of an example method for fabricating a semiconductor device using the process flows described in connection with FIGS. 1-67, according to an embodiment.

FIG. 68 illustrates a flow diagram of an example method for fabricating a semiconductor device using the process flows described in connection with FIGS. 1-67, according to an embodiment.

Referring now to FIG. 68, depicted is a flow diagram of a method 6800 for fabricating a semiconductor device with vertical metal routing at a core region using the process flows described in connection with FIGS. 1-67. The method 6800 may include steps 6802-6808. However, other embodiments may include additional or alternative steps, or may omit one or more steps altogether. The method 6800 can include or describe one or more materials, components, objects, layers, compositions, or structures in conjunction with FIGS. 1-67.

At step 6802, the method 6800 can include forming a semiconductor shell. The semiconductor shell can extend along a vertical direction. The semiconductor shell can include, for example, a first S/D structure and a second S/D structure (e.g., on opposite vertical ends of an epi, such as epi 102). In some cases, a high-k dielectric (e.g., high-k dielectric 106, etc.) can be a part of the semiconductor shell.

At step 6804, the method 6800 can include forming a first metal structure. The first metal structure can be surrounded by a lower portion of the semiconductor shell (e.g., the metal material 112 surrounded by the semiconductor shell).

At step 6806, the method 6800 can include forming a dielectric structure. The dielectric structure can be formed above the first metal structure (e.g., the dielectric material 110 above the first metal structure).

At step 6808, the method 6800 can include forming a second metal structure. The second metal structure can be formed through the dielectric structure (e.g., BPR 118, or other metal materials). Formed through the dielectric structure to establish an electrical connection with the first metal structure, for example. In various implementations, to form the second metal structure, an etching technique or process can be performed through the dielectric structure, such that the second metal structure can be deposited within a channel opening formed through the dielectric structure.

In one embodiment, a method of microfabrication of a transistor device may comprise forming a transistor shell with a dielectric core occupying a core area, the transistor shell formed of semiconductor material positioned perpendicular to a surface of a substrate in that a transistor channel current direction is perpendicular to the surface of the substrate and surrounds the core area; removing the dielectric core; filling a lower region of the core area with a first metal, the first metal in contact with a lower portions of the transistor shell as a first source/drain region contact; forming a first dielectric layer on the first metal; and forming a metal structure extending from the first metal to a top of the transistor shell.

In another embodiment, a method of microfabrication of a transistor device may comprise forming a transistor shell with a dielectric core occupying a core area, the transistor shell formed of semiconductor material positioned perpendicular to a surface of a substrate in that a transistor channel current direction is perpendicular to the surface of the substrate and surrounds the core area; removing the dielectric core; filling a lower region of the core area with a first metal, the first metal in contact with a lower portions of the transistor shell as a first source/drain region contact; depositing a second metal; forming a first dielectric layer on the first metal; filling a central portion of the core area with a second metal; forming side wall structures on a top portion of the transistor shell in the core area; and forming a metal structure extending from the second metal to a top of the transistor shell.

In another embodiment, a method of microfabrication of a transistor device may comprise forming a transistor shell as a channel of a field effect transistor, the transistor shell surrounding a core area, the transistor shell formed of semiconductor material positioned perpendicular to a surface of a substrate in that a transistor channel current direction is perpendicular to the surface of the substrate and surrounds the core area; forming a first metal structure within the core area, the first metal structure being in contact with a first source/drain region at a lower region of the core area and extending above a top of the transistor shell; and forming a second metal structure within the core area, the second metal structure being in contact with a gate region at a central region of the core area and that extending above a top of the transistor shell, wherein the first metal structure is insulated from the second metal structure and insulated from a second source/drain region at an upper region of the core area, and wherein the second metal structure is insulated from the first metal structure and insulated from the second source/drain region at an upper region of the core area.

The transistor shell may be formed by epitaxial growth around a core structure. The transistor shell may be formed by etching a core region from a core structure.

In another embodiment, a method of microfabrication of a transistor device may comprise forming a transistor shell as a channel of a field effect transistor, the transistor shell surrounding a core area, the transistor shell formed of semiconductor material positioned perpendicular to a surface of a substrate in that a transistor channel current direction is perpendicular to the surface of the substrate and surrounds the core area; forming a first metal structure within the core area, the first metal structure being in contact with a first source/drain region at a lower region of the core area and extending below a bottom of the transistor shell; and forming a second metal structure within the core area, the second metal structure being in contact with a gate region at a central region of the core area and that extending above a top of the transistor shell, wherein the first metal structure is insulated from the second metal structure and insulated from a second source/drain region at an upper region of the core area, and wherein the second metal structure is insulated from the first metal structure and insulated from the second source/drain region at an upper region of the core area.

In another embodiment, a microfabricated transistor device may comprise a vertical channel transistor formed on a substrate, the vertical channel transistor including a channel, a first source/drain region, a second source/drain region, and a gate region, the channel being a transistor shell of semiconductor material and having a linear path surrounding a core region in that a transistor channel current direction is perpendicular to the surface of the substrate and surrounds the core region, a first metal structure within the core area, the first metal structure being in contact with a first source/drain region at a lower region of the core area and extending above a top of the transistor shell; and a second metal structure within the core area, the second metal structure being in contact with a gate region at a central region of the core area and that extending above a top of the transistor shell, wherein the first metal structure is insulated from the second metal structure and insulated from a second source/drain region at an upper region of the core area, and wherein the second metal structure is insulated from the first metal structure and insulated from the second source/drain region at an upper region of the core area.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method for manufacturing semiconductor devices, the method comprising:
   forming a semiconductor shell that is separated from a substrate and extends along a vertical direction;
   forming a first metal structure surrounded by a lower end portion of the semiconductor shell;
   forming a dielectric structure above the first metal structure surrounded by the semiconductor shell;
   forming a metal gate around an inner sidewall of the semiconductor shell; and
   forming a second metal structure extending along the vertical direction, wherein the second metal structure is in electrical connect with the first metal structure and is separated from the metal gate.

2. The method of claim 1, wherein forming the semiconductor shell further comprises forming a first source/drain structure and a second source/drain structure, the method further comprising:
forming a third metal structure extending along the vertical direction and in electrical contact with a second metal gate around an outer sidewall of the semiconductor shell; and
forming a fourth metal structure extending along the vertical direction and in electrical contact with the first source/drain structure or the second source/drain structure.

3. The method of claim 1, wherein forming the semiconductor shell further comprises forming a first source/drain structure and a second source/drain structure and wherein the metal gate further includes a portion extending along the vertical direction beyond a top of the semiconductor shell, the method further comprising:
forming a third metal structure in electrical contact with the metal gate; and
forming a fourth metal structure extending along the vertical direction and in electrical contact with the first source/drain structure or the second source/drain structure.

4. The method of claim 3, further comprising:
forming a second semiconductor shell that extends along the vertical direction, wherein the second semiconductor shell comprises a third source/drain structure and a fourth source/drain structure, wherein the metal gate further includes a portion extending along the vertical direction beyond a top of the second semiconductor shell;
forming a fifth metal structure surrounded by a lower portion of the second semiconductor shell;
forming a second dielectric structure above the fifth metal structure;
forming a sixth metal structure in electrical contact with the metal gate; and
forming a seventh metal structure in electrical contact with the third source/drain structure and the fourth source/drain structure.

5. The method of claim 4, further comprising:
forming a power rail in electrical contact with the fifth metal structure;
wherein the power rail is disposed below the fifth metal structure.

6. The method of claim 1, wherein forming the semiconductor shell further comprises forming an outer shell surrounded by a second metal gate, and comprises forming a first source/drain structure and a second source/drain structure, the method further comprising:
forming a third metal structure through the dielectric structure to be in electrical contact with the metal gate;
forming a fourth metal structure in electrical contact with the second metal gate; and
forming a fifth metal structure in electrical contact with the first source/drain structure or the second source/drain structure.

7. The method of claim 1, wherein forming the semiconductor shell further comprises forming an outer shell surrounded by a second metal gate, and comprises forming a first source/drain structure and a second source/drain structure, the method further comprising:
forming the metal gate that includes a portion extending along the vertical direction beyond a top of the semiconductor shell, and is surrounded by the dielectric structure;
forming a third metal structure in electrical contact with the second metal gate;
forming a fourth metal structure in electrical contact with the metal gate; and
forming a fifth metal structure in electrical contact with the first source/drain structure or the second source/drain structure.

8. The method of claim 7, further comprising:
forming a power rail in electrical contact with the first metal structure;
wherein the power rail is disposed below the first metal structure.

9. The method of claim 1, wherein forming the semiconductor shell further comprises forming an outer shell surrounded by a second metal gate, and comprises forming a first source/drain structure and a second source/drain structure, the method further comprising:
forming the metal gate that includes a portion extending along the vertical direction beyond a top of the semiconductor shell and is surrounded by the dielectric structure;
removing at least a portion of the metal gate, thereby forming an opening surrounded by the semiconductor shell;
lining the opening with a third metal gate;
forming a third metal structure in electrical contact with the second metal gate;
forming a fourth metal structure in electrical contact with the third metal gate; and
forming a fifth metal structure in electrical contact with the first source/drain structure or the second source/drain structure, wherein the fifth metal structure is formed concurrently with the formation of the third metal gate.

10. The method of claim 1, wherein forming the semiconductor shell further comprises forming an outer shell surrounded by a second metal gate, and comprises forming a first source/drain structure and a second source/drain structure, the method further comprising:
forming the metal gate that surrounds the dielectric structure;
forming a third metal structure extending through the dielectric structure to be in electrical contact with the metal gate;
forming a fourth metal structure in electrical contact with the second metal gate; and
forming a fifth metal structure in electrical contact with the first source/drain structure or the second source/drain structure.

11. A semiconductor device, comprising:
a semiconductor shell separated from a substrate and extending along a vertical direction;
a first metal structure surrounded by a lower end portion of the semiconductor shell;
a dielectric structure above the first metal structure surrounded by the semiconductor shell;
a metal gate around an inner sidewall of the semiconductor shell; and
a second metal structure extending along the vertical direction, wherein the second metal structure in electrical contact with the first metal structure and is separated from the metal gate.

12. The semiconductor device of claim 11, wherein the semiconductor shell comprises a first source/drain structure and a second source/drain structure, the semiconductor device further comprises:

a third metal structure extending along the vertical direction and in electrical contact with a second metal gate around an outer sidewall of the semiconductor shell; and a fourth metal structure extending along the vertical direction and in electrical contact with the first source/drain structure or the second source/drain structure.

13. The semiconductor device of claim 11, wherein the semiconductor shell comprises a first source/drain structure and a second source/drain structure and wherein the metal gate further includes a portion extending along the vertical direction beyond a top of the semiconductor shell, the semiconductor device further comprises:

a third metal structure in electrical contact with the metal gate; and a fourth metal structure extending along the vertical direction and in electrical contact with the first source/drain structure or the second source/drain structure.

14. The semiconductor device of claim 13, further comprising:

a second semiconductor shell that extends along the vertical direction, wherein the second semiconductor shell comprises a third source/drain structure and a fourth source/drain structure and wherein the metal gate further includes a portion extending along the vertical direction beyond a top of the second semiconductor shell;

a fifth metal structure surrounded by a lower portion of the second semiconductor shell;

a second dielectric structure above the fifth metal structure;

a sixth metal structure in electrical contact with the metal gate;

a seventh metal structure in electrical contact with the third source/drain structure or the fourth source/drain structure; and a power rail in electrical contact with the fifth metal structure;

wherein the power rail is disposed below the fifth metal structure.

15. The semiconductor device of claim 11, wherein an outer shell of the semiconductor shell is surrounded by a second metal gate, and the semiconductor shell comprises a first source/drain structure and a second source/drain structure, the semiconductor device further comprises:

a third metal structure through the dielectric structure to be in electrical contact with the metal gate;

a fourth metal structure in electrical contact with the second metal gate; and a fifth metal structure in electrical contact with the first source/drain structure or the second source/drain structure.

16. The semiconductor device of claim 11, wherein an outer shell of the semiconductor shell is surrounded by a second metal gate, the semiconductor shell comprises a first source/drain structure and a second source/drain structure, and the metal gate includes a portion extending along the vertical direction beyond a top of the semiconductor shell and surrounded by the dielectric structure, the semiconductor device further comprises:

a third metal structure in electrical contact with the second metal gate;

a fourth metal structure in electrical contact with the metal gate;

a fifth metal structure in electrical contact with the first source/drain structure or the second source/drain structure; and a power rail in electrical contact with the first metal structure;

wherein the power rail is disposed below the first metal structure.

17. The semiconductor device of claim 11, wherein an outer shell of the semiconductor shell is surrounded by a second metal gate, the semiconductor shell comprises a first source/drain structure and a second source/drain structure, and the metal gate includes a portion extending along the vertical direction beyond a top of the semiconductor shell, and surrounded by the dielectric structure, the semiconductor device further comprises:

a third metal gate lined in an opening;

a third metal structure in electrical contact with the second metal gate;

a fourth metal structure in electrical contact with the third metal gate; and a fifth metal structure in electrical contact with the first source/drain structure or the second source/drain structure, wherein the fifth metal structure is formed concurrently with the formation of the third metal gate.

18. The semiconductor device of claim 11, wherein an outer shell of the semiconductor shell is surrounded by a second metal gate, the semiconductor shell comprises a first source/drain structure and a second source/drain structure, and the metal gate surrounds the dielectric structure, the semiconductor device further comprises:

a third metal structure extending through the dielectric structure to be in electrical contact with the metal gate;

a fourth metal structure in electrical contact with the second metal gate; and a fifth structure in electrical contact with the first source/drain structure or the second source/drain structure.

19. A method for manufacturing semiconductor devices, the method comprising:

forming a first semiconductor shell and a second semiconductor shell that both extend along a vertical direction, wherein the first semiconductor shell and the second semiconductor shell are separated from a substrate;

forming a first metal structure and a second metal structure surrounded by a lower end portion of the first semiconductor shell and a lower end portion of the second semiconductor shell, respectively;

forming a first dielectric structure above the first metal structure surrounded by the first semiconductor shell;

forming a second dielectric structure above the second metal structure surrounded by the second semiconductor shell;

forming a first metal gate around an outer sidewall of the first semiconductor shell;

forming a second metal gate around an inner sidewall of the second semiconductor shell;

forming a third metal structure extending along the vertical direction, wherein the third metal structure is in electrical contact with the first metal structure and is separated from the first metal gate; and forming a fourth metal structure extending along the vertical direction, wherein the fourth metal structure is in electrical contact with the second metal structure and is separated from the second metal gate.

20. The method of claim 19, wherein the first semiconductor shell comprises a first source/drain structure and a second source/drain structure, and wherein the second semiconductor shell comprises a third source/drain structure and a fourth source/drain structure, the method further comprises:

forming a fifth metal structure extending along the vertical direction and in electrical contact with the first metal gate;

forming a sixth metal structure extending along the vertical direction and in electrical contact with the first source/drain structure or the second source/drain structure;

forming the second metal gate that further includes a portion extending along the vertical direction beyond a top of the second semiconductor shell;

forming a seventh metal structure in electrical contact with the second metal gate; and forming an eighth metal structure extending along the vertical direction and in electrical contact with the third source/drain structure or the fourth source/drain structure.

* * * * *